United States Patent
Hurrell et al.

(10) Patent No.: US 10,333,543 B1
(45) Date of Patent: Jun. 25, 2019

(54) ANALOG-TO-DIGITAL CONVERTER WITH NOISE-SHAPED DITHER

(71) Applicant: Analog Devices Global Unlimited Company, Hamilton (BM)

(72) Inventors: Christopher Peter Hurrell, Cookham (GB); Hongxing Li, Andover, MA (US); Colin G. Lyden, Baltimore (IE)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 15/975,885

(22) Filed: May 10, 2018

(51) Int. Cl.
*H03M 1/20* (2006.01)
*H03M 1/06* (2006.01)
*H03M 1/46* (2006.01)

(52) U.S. Cl.
CPC ......... *H03M 1/201* (2013.01); *H03M 1/0641* (2013.01); *H03M 1/462* (2013.01); *H03M 1/468* (2013.01)

(58) Field of Classification Search
CPC .... H03M 1/201; H03M 1/468; H03M 1/0641; H03M 1/462
USPC ........................................ 341/172, 155, 131
See application file for complete search history.

(56) References Cited

U.S. PATENT DOCUMENTS

| | | | |
|---|---|---|---|
| 7,218,259 B2 | 5/2007 | Hurrell et al. | |
| 7,286,075 B2 * | 10/2007 | Hennessy | H03M 1/0639 341/144 |
| 7,663,518 B2 * | 2/2010 | Hurrell | H03M 1/0641 341/131 |
| 8,766,839 B2 | 7/2014 | Janakiraman et al. | |
| 8,810,443 B2 | 8/2014 | Steensgaard-Madsen | |
| 9,270,288 B2 * | 2/2016 | Perrott | H03L 7/093 |
| 2016/0352347 A1 * | 12/2016 | Fernando | H03M 1/1009 |

OTHER PUBLICATIONS

Shu, Yun-Shiang, et al., "An Oversampling SAR ADC with DAC Mismatch Error Shaping Achieving 105dB SFDR and 101dB SNDR over 1kHz BW in 55nm CMOS", Mediatek—ISSCC 2016 Session 27 Hybrid and Nyquist Data Converters, (2016), 457-459.

* cited by examiner

*Primary Examiner* — Jean B Jeanglaude
(74) *Attorney, Agent, or Firm* — Schwegman Lundberg Woessner, P.A.

(57) ABSTRACT

Techniques that allow application of noise-shaped dither without applying dither at sampling, resulting in the analog-to-digital converter (ADC) circuit advantageously being balanced during acquisition. Balancing the ADC circuit at acquisition can reduce the risk of sampling digital interferences that can couple in through the references or substrates.

20 Claims, 15 Drawing Sheets

US 10,333,543 B1

ANALOG-TO-DIGITAL CONVERTER WITH NOISE-SHAPED DITHER

FIELD OF THE DISCLOSURE

This document pertains generally, but not by way of limitation, to integrated circuits, and more particularly, to analog to digital converter circuits and systems.

BACKGROUND

In many electronics applications, an analog input signal is converted to a digital output signal (e.g., for further digital signal processing). For instance, in precision measurement systems, electronics are provided with one or more sensors to make measurements, and these sensors can generate an analog signal. The analog signal can then be provided to an analog-to-digital converter (ADC) circuit as input to generate a digital output signal for further processing. In another instance, in a mobile device receiver, an antenna can generate an analog signal based on the electromagnetic waves carrying information/signals in the air. The analog signal generated by the antenna can then be provided as input to an ADC to generate a digital output signal for further processing.

SUMMARY OF THE DISCLOSURE

The techniques of this disclosure allow application of noise-shaped dither without applying the dither at sampling, resulting in the analog-to-digital converter (ADC) circuit advantageously being balanced during acquisition. Balancing the ADC circuit at acquisition can reduce the risk of sampling digital interferences that can couple in through the references or substrates.

In some aspects, this disclosure is directed to an analog-to-digital converter (ADC) circuit to apply noise-shaped dither after a sampling phase. The ADC circuit comprises a digital-to-analog converter (DAC) circuit having a capacitor array and a dither control circuit configured to control, after the sampling phase, a selection between at least two capacitors, including: a capacitor in the array to receive a dither signal and a capacitor in the array to be set dependent on a comparator decision during a conversion.

In some aspects, this disclosure is directed to a method of applying noise-shaped dither after a sampling phase in an analog-to-digital converter (ADC) circuit. The method comprises providing a digital-to-analog converter (DAC) circuit having a capacitor array, and controlling, after the sampling phase, a selection between at least two capacitors, including: a capacitor in the array to receive a dither signal; and a capacitor in the array to be set dependent on a comparator decision during a conversion.

In some aspects, this disclosure is directed to an analog-to-digital converter (ADC) circuit to apply noise-shaped dither after a sampling phase. The ADC circuit comprises a digital-to-analog converter (DAC) circuit having a capacitor array, and means for controlling, after the sampling phase, a selection between at least two capacitors, including: a capacitor in the array to receive a dither signal, and a capacitor in the array to be set dependent on a comparator decision during a conversion.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

A dither signal is an offset signal intentionally added in the analog domain, which is later removed from the digital domain. The added dither signal (or simply "dither") can help reduce non-linearity errors that can be present in the system, for example. By adding dither, the non-linearity errors can be transformed into noise, or "dither noise". If the dither is randomly applied, the dither noise generated can be a random noise, e.g., white noise. However, if noise-shaped dither is applied, then noise-shaped dither noise is generated. Noise-shaped dither noise that has more components at higher frequencies and fewer components at low frequencies, thereby desirably pushing noise away from a signal band of interest, for example.

The techniques of this disclosure allow application of noise-shaped dither without applying the dither at sampling, resulting in the analog-to-digital converter (ADC) circuit advantageously being balanced during acquisition. Balancing the ADC circuit at acquisition can reduce the risk of sampling digital interferences that can couple in through the references or substrates.

As described in more detail below, after sampling, a dither control circuit can control a selection of a capacitor in a group of a capacitor array in the analog-to-digital converter (ADC) circuit to receive a dither signal and another capacitor in the group of the array to be set dependent on a comparator decision during a conversion. That is, a dither control circuit can select a capacitor in the group as a dither capacitor and apply a dither signal to the selected capacitor before the bit trial process, and the other capacitor can be selected to receive a result of a bit trial decision. In this manner, each time the dither control circuit selects one capacitor in a group as a bit trial capacitor, the dither control circuit selects the other capacitor in the group as a dither capacitor.

Figure 1:
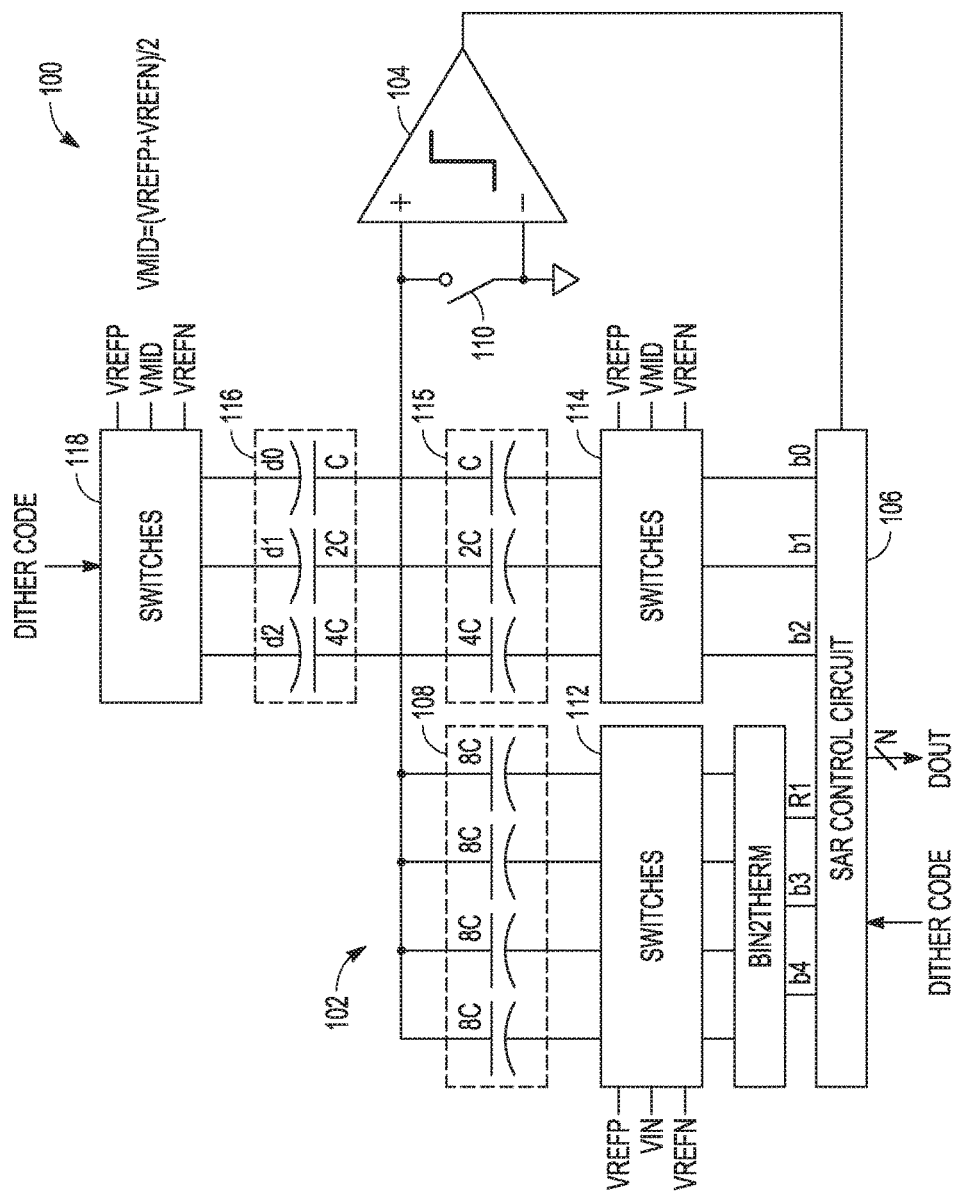
FIG. 1 is a schematic diagram of an example of an analog-to-digital converter circuit.

FIG. 1 is a schematic diagram of an example of an analog-to-digital converter circuit. The analog-to-digital converter (ADC) circuit 100 of FIG. 1 is a successive approximation register (SAR) ADC, the operation of which being known to those of ordinary skill in the art. The SAR ADC circuit 100 can include a digital-to-analog converter (DAC) circuit 102, e.g., a switched capacitor array, a comparator circuit 104, and SAR logic control and computation circuitry 106.

The SAR logic control circuitry 106 can control the DAC operation, such as during the bit trials (charge balancing a reference charge stored on the bit trial capacitors against a sampled charge). The SAR logic control and computation circuitry 106 initiates a sample of an input voltage, initiates the first conversion of the sampled input voltage to a first set of bit values, such as using a first set of bit trials, and initiates a second conversion of a second sampled input voltage to a second set of bit values, such as using a second set of bit trials, and so forth.

The SAR logic control and computation circuitry 106 can include a state machine or other digital engine to perform functions such as progressing the ADC through different states of operation and to perform the calculations described. The SAR logic control and computation circuitry 106 can determine a final N-bit digital output value for the sampled input, and the final N-bit digital value can be made available as a digital output Dout. In some configurations that use dither, such as shown in FIG. 1, the SAR logic control and computation circuitry 106 can receive the dither code as an input to allow it to compute the digital output Dout.

The DAC circuit 102 shown in FIG. 1 is a switched capacitor DAC that includes an array of capacitors. The DAC circuit 102 can include at least N weighted circuit components, such as where the weight (e.g., capacitance value) of a particular weighted circuit component can be specified relative to that of one or more other weighted circuit components, with N being a positive integer. In certain examples, N is equal to sixteen and the weighted circuit components include sixteen capacitors (for example, with the sixteen capacitors including different multiples of a specified unit capacitor to obtain the weighting relative to each other).

A portion of the DAC circuit 102 can be a sampling DAC circuit 108. During a sampling phase, the SAR logic control circuitry 106 can control operation of a top plate sampling switch 110, e.g., coupling the top plate switch 110 to ground or a common mode voltage, and control switches 112 to sample an analog input voltage Vin onto the bottom plates of the capacitors in the sampling DAC 108. In this disclosure, the terms "top plates" and "bottom plates" are used for convenience in describing the figures and are not meant to imply that there is any required spatial orientation for the capacitors.

In some example implementations, during sampling, only the capacitors in the sampling DAC 108 sample the input signal Vin that was applied at an input of the ADC circuit 100. For example, only the capacitors representing the most significant bits (MSBs) sample the input signal Vin. All other capacitors shown, including the capacitors 115 representing the least significant bits (LSBs) can be non-sampling capacitors and the SAR logic control circuitry 106 can couple the switches 114, 118 as needed to set these non-sampling capacitors to a midscale voltage Vmid.

In other example implementations, capacitors in addition to the capacitors in the sampling DAC 108 can sample the input signal Vin. For example, one or more capacitors of a dither DAC circuit 116 can sample the input voltage Vin. In some example implementations, the midscale voltage Vmid can be equal to (Vrefp+Vrefn)/2, where Vrefp is a positive reference voltage and Vrefn is a negative reference voltage. The sample is considered to have been taken when SAR logic control circuitry 106 opens the top plate switch 110.

In addition to a sampling DAC 108, the ADC circuit 100 can include a dither DAC circuit 116. The performance of the ADC circuit 100 can be improved by deliberately introducing noise (or "dither"). The introduction of a random or pseudo-random dither signal, can improve the performance of the ADC circuit. The introduction of dither can allow the SAR logic control circuitry 106 to find different capacitor DAC codes for the same input signal, then this can be used to provide an improvement in the fine integral nonlinearity (INL) of the ADC. The amount of dither added is generally subtracted from the final digital word.

After sampling, the SAR logic control circuitry 106 can generate and apply a random or pseudo-random dither code to control one or more of switches 118 coupled to the dither DAC circuit 116. Using the dither code, each capacitor of the dither DAC 116 can be coupled to positive reference voltage Vrefp or negative reference voltage Vrefn. The SAR conversion process can begin after the dither code has been applied. In the non-limiting example configuration of FIG. 1, bits b4 (16 units), b3 (8 units), redundant bit r1 (8 units), b2 (4 units), b1 (2 units) and b0 (1 unit) are determined by the SAR conversion process.

A conversion may start with the DAC circuit 102 set to midscale, for example. An output voltage of the DAC circuit 102 can be compared to the sampled voltage, such as using the comparator circuit 104. The comparator 104 can determine whether the output of the DAC circuit 102 is greater than or less than the sampled input voltage Vin, and the result of the comparison can be stored as a one or zero for that bit of the DAC. Based on the output of the comparator circuit 104, the SAR logic control circuitry 106 can couple the switches 112 (and switches 114, when needed for the LSBs) to positive reference voltage Vrefp or negative reference voltage Vrefn to correspond to a bit value. The conversion then proceeds to the next bit value until all bits of the digital value are determined. One iteration of comparing the voltage to the input voltage and changing the DAC accordingly can be referred to as a bit trial or a bit determination. Before testing, bits b2-b0 may be at 1 or 0. These bits may be set for testing. They then may be kept or rejected depending on a comparator decision.

As described in detail below, the capacitors in a capacitor array, e.g., capacitors 115, 116 of FIG. 1, can be grouped (conceptually) based on their "weight" and using the techniques of this disclosure, after sampling, a dither control circuit can control a selection of a capacitor in a group of the array to receive a dither signal and another capacitor in the group of the array to be set dependent on a comparator decision during a conversion. That is, the dither control circuit can select a capacitor in the group as a dither capacitor and apply a dither signal to the selected capacitor before the bit trial process, and the other capacitor can be selected to receive a result of a bit trial decision. In this manner, each time the dither control circuit selects one capacitor in a group as a bit trial capacitor, the dither control circuit selects the other capacitor in the group as a dither capacitor. It should be noted that although the capacitor groups 115 and 116 in FIG. 1 do not sample the input, this need not be the case. Rather, any one of the capacitors in capacitor groups 115 and 116 may be configured to sample the input with appropriate changes to the switches and SAR control.

Figure 2:
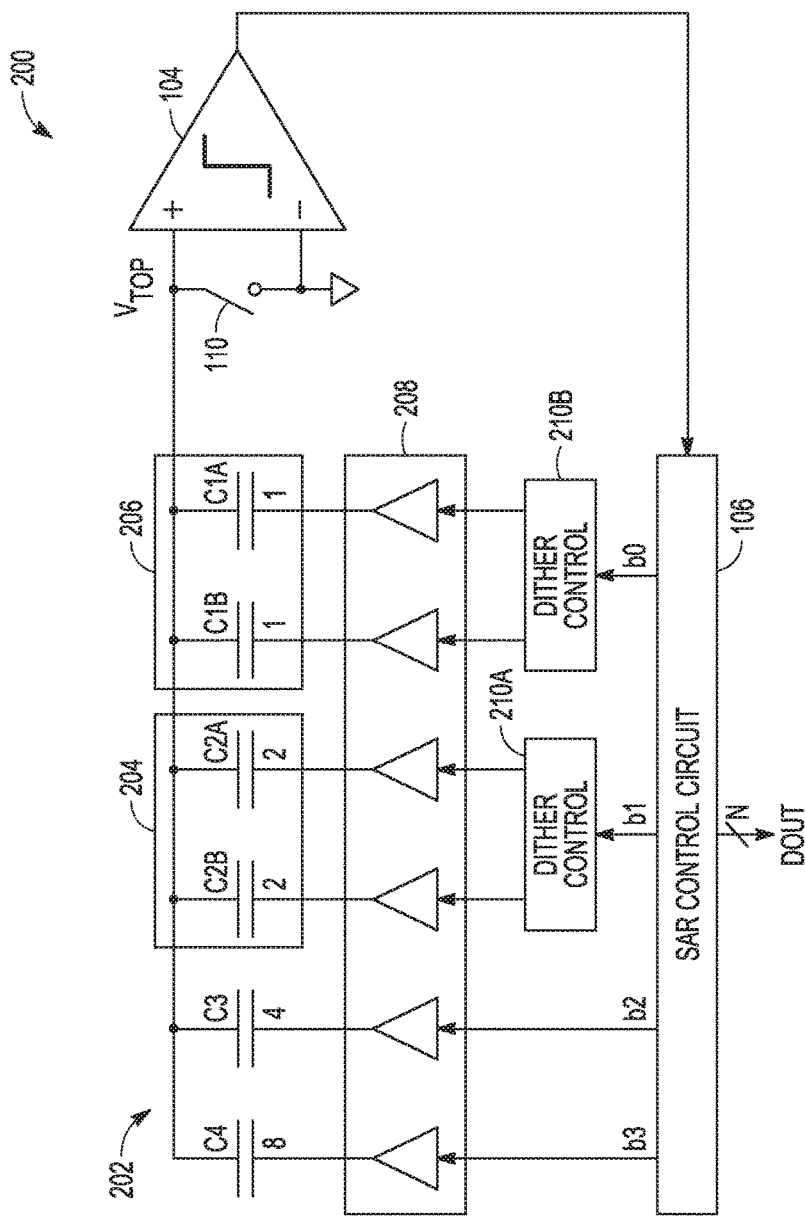
FIG. 2 is a schematic diagram of an example of an analog-to-digital converter circuit that can implement various techniques of this disclosure.

FIG. 2 is a schematic diagram of an example of an analog-to-digital converter circuit that can implement various techniques of this disclosure. The ADC circuit 200 of FIG. 2 is a SAR ADC circuit and can include a DAC circuit 202, e.g., a switched capacitor DAC, a comparator circuit 104, and SAR logic control circuitry 106. It should be noted that although the techniques of this disclosure are described with respect to a SAR ADC circuit, the techniques are not limited to SAR ADC circuits. Rather, SAR logic control is one example of a control circuit that can be used. In other examples, a flash ADC could be used to produce a bit decision, e.g., "b1", "b0" of FIG. 2. The techniques of this disclosure can also be utilized by delta-sigma ADC circuits.

In FIG. 2, capacitors C4 and C3, e.g., binary weighted with weights 8 and 4, respectively, represent at least some of the sampling capacitors of the ADC circuit 200. At least some of the non-sampling capacitors of FIG. 1, which, in some example implementations, can include the dither capacitors of the dither DAC circuit 116 and the LSB capacitors 115, have been grouped together (conceptually) in FIG. 2 as groups 204, 206 based on their weight. Similarly weighted capacitors C2a and C2b are in group 204 (each with weight 2) and similarly weighted capacitors C1a and C1b are in group 206 (each with weight 1). It should be noted that capacitors C2a, C2b and C1a, C1b, can be constructed and arranged for split bottom plate sampling in some implementations.

As mentioned above, based on the output of the comparator circuit 104, the SAR logic control circuitry 106 can couple the switches 208 to Vrefp or Vrefn to correspond to a bit value. As seen in FIG. 2, the SAR logic control circuitry 106 has determined four bit values, namely b3-b0, where bit values b3 and b2 are applied to capacitors C4 and C3.

Using various techniques of this disclosure, a dither control circuit, e.g., dither control circuits 210A, 210B, can receive from the SAR logic control circuitry 106 a result of the bit trial decision, e.g., bit trial results "b1 and "b0", respectively. A dither control circuit can select a capacitor in a group as a dither capacitor and apply a dither signal to the selected capacitor before the bit trial process, and select the other capacitor to receive a result of a bit trial decision.

For example, the dither control circuit 210A can receive a comparator decision during a conversion, e.g., bit trial result "b1", from the SAR logic control circuitry 106 and can control a selection of a capacitor in the array, e.g., either capacitor C2b or C2a, to receive a dither signal, generated within the dither control circuit or externally, and another capacitor in the array, e.g., the other capacitor of capacitors C2b and C2a, to be set dependent on the comparator decision, e.g., using bit trial result "b1". In other words, the two capacitors are paired such that when one capacitor is selected to receive the dither signal, the other capacitor is set dependent on the comparator decision.

Similarly, the dither control circuit 210B can receive a comparator decision during a conversion, e.g., bit trial result "b0", from the SAR logic control circuitry 106 and can control a selection of a capacitor in the array, e.g., either capacitor C1b or C1a, to receive a dither signal and another capacitor in the array, e.g., the other capacitor of capacitors C1b and C1a, to be set dependent on the comparator decision. In this manner, each time a dither control circuit selects one capacitor as a bit trial capacitor, the dither control circuit selects the other capacitor as a dither capacitor.

Figure 3:
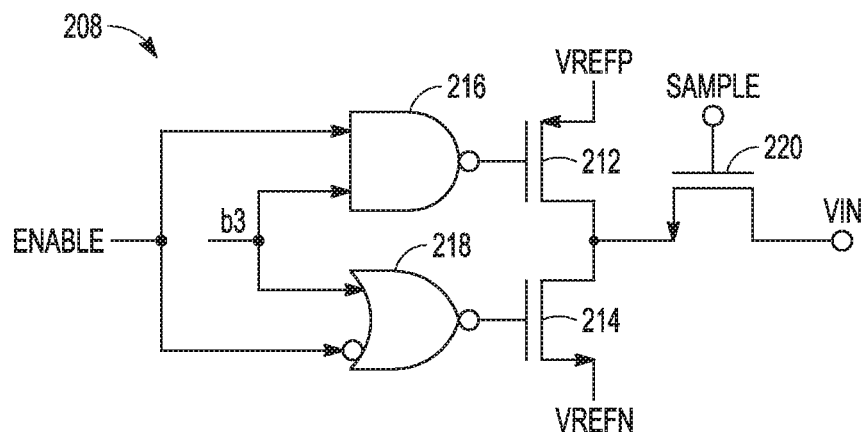
FIG. 3 is a schematic diagram of an example of one of the switches of FIG. 2.

FIG. 3 is a schematic diagram of an example of one of the switches 208 of FIG. 2. In FIG. 3, a source terminal of a p-type transistor 212, e.g., p-type metal-oxide-semiconductor field effect transistor (MOSFET), is coupled to a positive reference voltage Vrefp and a drain terminal of transistor 212 is coupled to a drain terminal of an n-type transistor 214. A source terminal of transistor 214 is coupled to a negative reference voltage Vrefn. The gate terminals of transistors 212, 214 are coupled to the outputs of a NAND gate 216 and a NOR gate 218, respectively.

As seen in FIG. 3, an "enable" signal, which during a bit trial phase is a high logic level, is applied to an input of each of a NAND gate 216 and a NOR gate 218. The other input of each of the NAND gate 216 and the NOR gate 218 is configured to receive the result of a bit trial, e.g., "b3" as shown in FIG. 3. Based on the bit trial result of b3, for example, a bottom plate of capacitor C4 is coupled to Vrefp or Vrefn.

FIG. 3 also depicts a sample switch 220, e.g., field-effect transistor. A control terminal of the switch 220, e.g., gate terminal, is coupled to a "sample" signal. A first terminal of the switch 220, e.g., a drain terminal, is coupled to input signal "$V_{IN}$", and a second terminal of the switch 220, e.g., source terminal, is coupled to between transistors 212, 214. A "sample" signal controls the sample switch 220 to sample the input signal $V_{IN}$ onto a coupled capacitor, e.g., capacitor C4 of FIG. 2. For non-sampling capacitors, no sample switch is needed.

Figure 4:
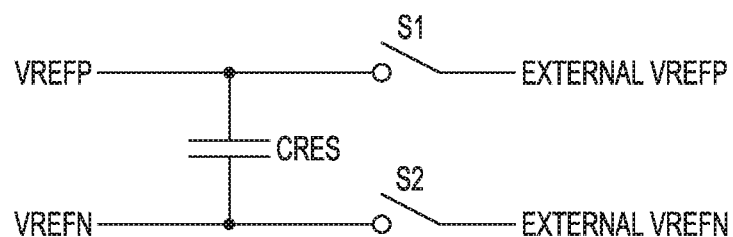
FIG. 4 is a schematic diagram of an example of a use of a reservoir reference capacitor to provide a positive reference voltage and a negative reference voltage for an ADC circuit.

FIG. 4 is a schematic diagram of an example of a use of a reservoir reference capacitor to provide a positive reference voltage and a negative reference voltage for an ADC circuit. In some example implementations, positive reference voltage Vrefp and negative reference voltage Vrefn can be generated from a pre-sampled reservoir reference capacitor Cres that can be positioned adjacent the capacitor array of the ADC circuit. For example, the top plate and the bottom plate of the reservoir reference capacitor Cres can first be coupled via switches S1, S2, respectively, to external reference voltages Vrefp and Vrefn. Then, the switches S1, S2 can be opened to allow bottom plates of the bit trial capacitors, e.g., capacitor C4 of FIG. 2, to couple to the reservoir reference capacitor Cres.

In some implementations, only one of switches S1, S2 is needed. In some example implementations, each bit trial capacitor, e.g., capacitor C4 of FIG. 2, can be associated with a dedicated reservoir reference capacitor Cres. In other example implementations, the bit trial capacitors can share a reservoir reference capacitor Cres. In an example of a reservoir reference capacitor is described in commonly assigned U.S. Pat. No. 8,390,502 to Ronald Kapusta and titled "CHARGE REDISTRIBUTION DIGITAL-TO-ANALOG CONVERTER," the entire content of which being incorporated herein by reference.

Figure 5:
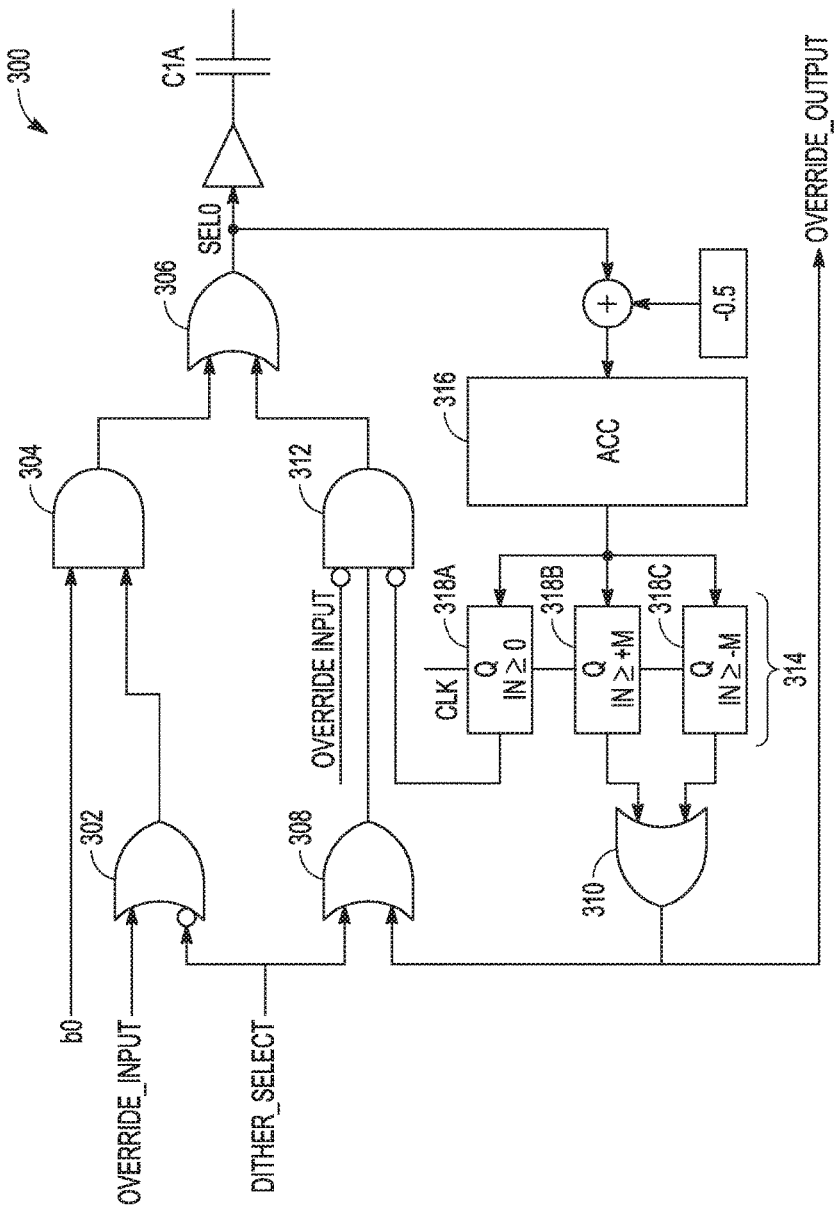
FIG. 5 is a schematic diagram of an example of a dither control half circuit that can be used to implement various techniques of this disclosure.

FIG. 5 is a schematic diagram of an example of a dither control half circuit 300 that can be used to implement various techniques of this disclosure. The dither control half circuit 300 can form half of a dither control circuit, e.g., dither control circuit 210A or 210B in FIG. 2. For example, the dither control half circuit 300 of FIG. 5 can control the capacitor C1a in FIG. 2 and another substantially identical half circuit (not depicted) can control the capacitor C1b in FIG. 2, where the two half circuits together form an example of the dither control circuit 210B of FIG. 2. Only one dither control half circuit 300 is shown and described, for purposes of conciseness.

In the example shown in FIG. 5, the dither control half circuit 300 is configured to receive three input signals: 1) a comparator decision, e.g., a bit trial result (shown as "b0", as an example), 2) an override input signal ("override_input") from the other half circuit, and 3) a dither select signal ("dither_select") from the control logic, e.g., SAR logic control circuitry 106 of FIG. 2. The dither select signal can be, for example, a random signal, a pseudo-random signal, and a chopping signal.

The dither control half circuit 300 of FIG. 5 is configured to produce two output signals: a select signal (e.g., "sel0" in FIG. 5) to be applied to a selected capacitor, e.g., C1a or C1b of FIG. 2, and an override output signal ("override_output") to be received by the other half circuit as an override input signal. The select signal can be either a dither signal or the result of a comparator decision and can control a state of a capacitor to which it is applied, e.g., a state representing a "1" and a state representing a "0".

In operation, if the dither select signal is low, e.g., indicating that a result of a bit trial decision should be used, a "0" is applied and inverted at a first input of OR gate 302 and the override input signal is applied to a second input of OR gate 302. Irrespective of the state of the override input signal, the output of the OR gate 302 is a "1" and is fed to a first input of AND gate 304 and the bit trial result "b0" is fed to the second input of AND gate 304. The AND gate 304 outputs the bit trial result "b0" and, when applied to OR gate 306, the OR gate 306 outputs the bit trial result "b0" as signal "sel0", which is applied to capacitor C1a.

If the dither select signal is high, e.g., indicating that dither should be applied, a "1" is applied and inverted at the first input of OR gate 302 and the override input signal is applied to a second input of OR gate 302. If the override input signal is low, the output of the OR gate 302 is a "0" and is fed to the first input of AND gate 304. The bit trial result "b0" is fed to the second input of AND gate 304 and, regardless of "b0", the output of AND gate 304 is "0".

Continuing the example in which the dither select signal is high, a "1" is applied to a first input of OR gate 308 along with an output of OR gate 310 (which is described below). The OR gate 308 outputs a "1" to a first input of AND gate 312. The AND gate 312 receives and inverts the override input signal at a second input and receives and inverts an output of a limit circuit 314 (which is described below). Assuming that the override input signal and the output of the limit circuit 314 are each "0", the AND gate 312 activates and outputs a dither signal and allows the capacitor C1a to be driven with the dither signal.

The dither control half circuit 300 further includes a digital filter circuit 316, e.g., accumulator, integrator, counter, that is configured to accumulate a history of the signal "sel0", e.g., a running total of the 1s and 0s of "sel0". In FIG. 5, the signal "sel0" is summed with a value, e.g., shown as −0.5, and applied to an input of digital filter circuit 316.

The limit circuit 314 is coupled to an output of the digital filter circuit 316. An output of the limit circuit 314 is used to bound the accumulation of the accumulator circuit 316. The limit circuit 314 can be configured to compare the digital filter circuit output to a limit, and the output of the limit circuit 314 can be used to prevent a capacitor in the array, e.g., capacitor C1a, from being selected to be set dependent on the comparator decision, e.g., bit trial result "b0".

The output of the digital filter circuit 316 is coupled to the inputs of three quantizers 318A-318C, e.g., three 1-bit quantizers, of the limit circuit 314. The quantizer 318A compares its input (the output of the digital filter circuit 316) to the value 0 and outputs a "1" if its input is greater than or equal to 0. The "1" output from the quantizer 318A is applied to and inverted at an input of AND gate 312 resulting in a "0" at the output of the AND gate 312, which is applied to an input of OR gate 306, which forces the "sel0" to "0".

To make capacitor C1a sensitive to the accumulated history of the signal "sel0", the dither select signal should be set to "1". When the dither select signal is "1", the OR gate 308 outputs a "1", which activates the AND gate 312 (if the override input signal and the output of the quantizer 318A are both "0") and allows the capacitor C1a to be driven with the dither signal via the OR gate 306. Setting the dither select signal to "1" attempts to bring the accumulated history in the digital filter circuit 316 back to "0".

The digital filter circuit 316 has a limited number of bits. As an example, if the dither select signal includes a long string of zeroes, the top portion of the dither control half circuit 300 of FIG. 5 would be enabled for the entire string of zeroes. If the bit trial result "b0" was "1", signal "sel0" would continue being a "1" and the accumulated history in the digital filter circuit 316 would ramp up.

To prevent the digital filter circuit 316 from "wrapping around" an upper limit or lower limit of the digital filter circuit, the digital control half circuit 300 of FIG. 5 can include the quantizers 318B and 318C, where each can compare an input (the output of the digital filter circuit 3196) to upper and lower limits, e.g., of the digital filter circuit. For example, the quantizer 318B compares its input to an upper limit +M, e.g., of digital filter circuit 316, and outputs a "1" if its input is greater than or equal to (+M). Similarly, the quantizer 318C compares its input to a lower limit (−M), e.g., of digital filter circuit 316, and outputs a "1" if its input is less than or equal to (−M).

As seen in FIG. 5, the output of each of the quantizers 318B, 318C is fed to the OR gate 310. If either the upper limit (+M) or the lower limit (−M) is met or exceeded, the output of the OR gate 310 outputs a "1". By outputting a "1", the OR gate 310 enables the dither select path via the OR gate 308 even if the dither select signal is "0". So, if the accumulated history of the signal "sel0" is near the top half or the bottom half of the range of the digital filter circuit 316, the quantizers 318B, 318C attempt to bring the accumulation closer to a center of the range, e.g., an accumulation of "0". In addition, by outputting a "1", the OR gate 310 provides the override output signal to the other dither control half circuit (not depicted) that controls the capacitor C1$b$ of FIG. 2. The override output signal forces the other half circuit (not depicted) to control the capacitor C1$b$ of FIG. 2 to be used for bit trials. The other half circuit (not depicted) can similarly output an override output signal that is received by the dither control half circuit 300 of FIG. 5 as the override input signal.

In this manner, a dither control circuit, e.g., dither control circuit 210B of FIG. 2, can select a capacitor in the group as a dither capacitor and apply a dither signal to the selected capacitor before the bit trial process, and the other capacitor can be selected to receive a result of a bit trial decision.

Figure 6:
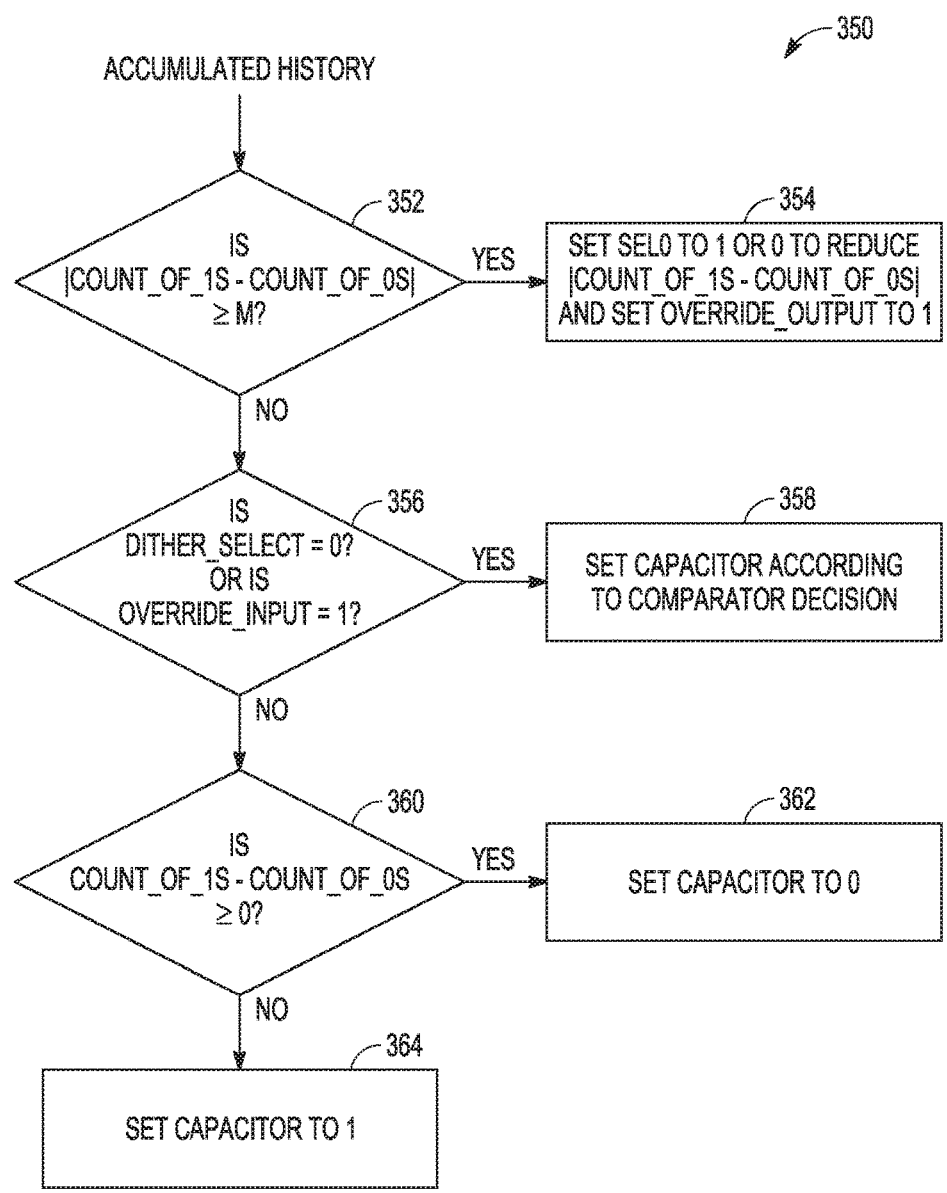
FIG. 6 is a flow diagram depicting an operation of the dither control half circuit of FIG. 5.

FIG. 6 is a flow diagram depicting an operation of the dither control half circuit 300 of FIG. 5. The flow diagram 350 begins with the accumulated history of the digital filter circuit 300 of FIG. 5 being compared to a limit at decision block 352. In particular, if the absolute value of the difference between the accumulated 1s and 0s is greater than or equal to a limit M, e.g., as determined using the quantizers 318B, 318C of FIG. 5, ("YES" branch of decision block 352), then, at block 354, the dither control half circuit 300 of FIG. 5 can perform two operations: 1) set the signal "sel0" to "1" or "0" to reduce the absolute value of that difference (e.g., attempts to bring the accumulated history in the digital filter circuit 316 back to "0"); and 2) set the override output signal to "1" to force the capacitor controlled by the other half circuit to be used for bit trials.

If the absolute value of the difference between the accumulated 1s and 0s is not greater than or equal to a limit M ("NO" branch of decision block 352), then the flow diagram moves to decision block 356. If either the dither select signal is "0" or the override input signal is "1" ("YES" branch of decision block 356), then, at block 358, the dither control half circuit 300 of FIG. 5 can set the capacitor C1$a$ according to a comparator decision, e.g., using "b0".

If neither the dither select signal is "0" nor the override input signal is "1", ("NO" branch of decision block 356) then the flow diagram moves to decision block 360. If the difference between the accumulated 1s and 0s is greater than or equal to 0, e.g., as determined using the quantizer 318A of FIG. 5, ("YES" branch of decision block 360), then, at block 362, the dither control half circuit 300 of FIG. 5 can set the capacitor C1$a$ to "0". If the difference between the accumulated 1s and 0s is not greater than or equal to 0, ("NO" branch of decision block 360), then, at block 364, the dither control half circuit 300 of FIG. 5 can set the capacitor C1$a$ to "1".

Figure 7:
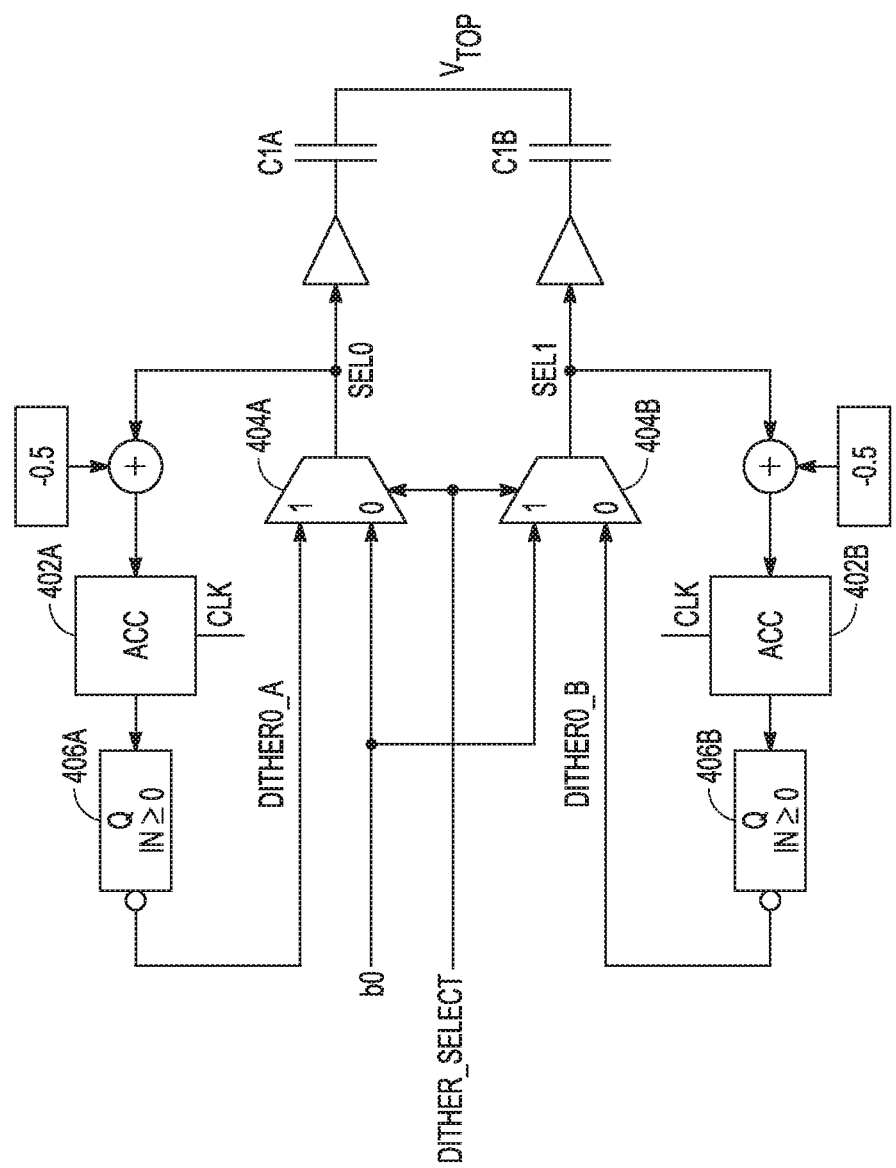
FIG. 7 is a schematic diagram of another example of a dither control circuit that can be used to implement various techniques of this disclosure.

FIG. 7 is a schematic diagram of another example of a dither control circuit that can be used to implement various techniques of this disclosure. The dither control circuit 400 shown in FIG. 7 can control both capacitors C1$a$ and C1$b$. The dither control circuit 400 is an example of dither control circuits 210A, 210B in FIG. 2.

A select signal (e.g., "sel0" and "sel1") can be applied to a selected capacitor, e.g., C1$a$ or C1$b$. The select signal can be either a dither signal or the result of a comparator decision and can control a state of a capacitor to which it is applied, e.g., a state representing a "1" and a state representing a "0".

In the example shown in FIG. 7, the dither control circuit 400 is configured to receive two input signals: a comparator decision, such as a bit trial result (shown as "b0", as an example) and a dither select signal ("dither_select") from the control logic, e.g., SAR logic control circuitry 106 of FIG. 2. The dither select signal can be, for example, a random signal, a pseudo-random signal, and a chopping signal.

The dither control circuit 400 of FIG. 7 further includes a digital filter circuit 402A, e.g., accumulator, integrator, counter, that is configured to accumulate a history of the output of a multiplexer ("mux") 404A, e.g., a running total of the 1s and 0s. In FIG. 7, the output of the mux 404A is summed with a value, e.g., shown as −0.5, and applied to an input of the digital filter circuit 402A. If the output of the mux 404A is a "1", then the accumulation of the digital filter circuit 402A increases, and if the output of the mux 404A is a "0", then the accumulation of the digital filter circuit 402A decreases.

The output of the digital filter circuit 402A is coupled to an input of quantizer 406A, e.g., a 1-bit quantizer. The quantizer 406A compares its input (the output of the digital filter circuit 402A) to the value 0 and outputs a "0" to the "1" input of the mux 404A if its input is greater than or equal to 0.

The mux 404A, which is controlled by the dither select signal, is configured to receive 1) the output of the quantizer 406A at its "1" input and 2) a comparator decision at its "0" input, e.g., bit trial result b0 from FIG. 2. The dither select signal selects which capacitor, e.g., C1$a$ or C1$b$, receives a dither signal and which capacitor receives the result of a comparator decision, e.g., bit trial result "b0", by selecting one of the first and second inputs of the mux 404A.

If the dither select signal is low, then the dither control circuit 400 sets capacitor C1$a$ according to the comparator decision, e.g., using bit trial result "b0".

If the dither select signal is high and the accumulation of the digital filter circuit 402A is greater than or equal to 0, then the mux 404A receives a "0" from the quantizer 406A and the dither control circuit 400 sets the capacitor C1$a$ to "0". If the dither select signal is "1" and the accumulation of the digital filter circuit 402A is less than 0, then the mux 404A receives a "1" from the quantizer 406A and the dither control circuit 400 of FIG. 7 sets the capacitor C1$a$ to 1.

The bottom portion of the dither control circuit 400 includes a mux 404B, a quantizer 406B, e.g., 1-bit quantizer, and a digital filter circuit 402B. The bottom portion operates in a manner similar to the top portion of FIG. 7 described above and, for purposes of conciseness, will not be described in detail. It should be noted that the bottom portion operates in a complementary manner to the top portion. For example, if the dither select signal is low, then the dither control circuit 400 1) sets capacitor C1$a$ according to the comparator decision, e.g., using bit trial result "b0", and 2) sets capacitor C1$b$ to receive a dither signal, e.g., 0 or 1 depending on the accumulation of the digital filter circuit 402B, as described above. The dither control circuit 400 of FIG. 7 does not include a limit circuit, as in FIG. 5.

Figure 8:
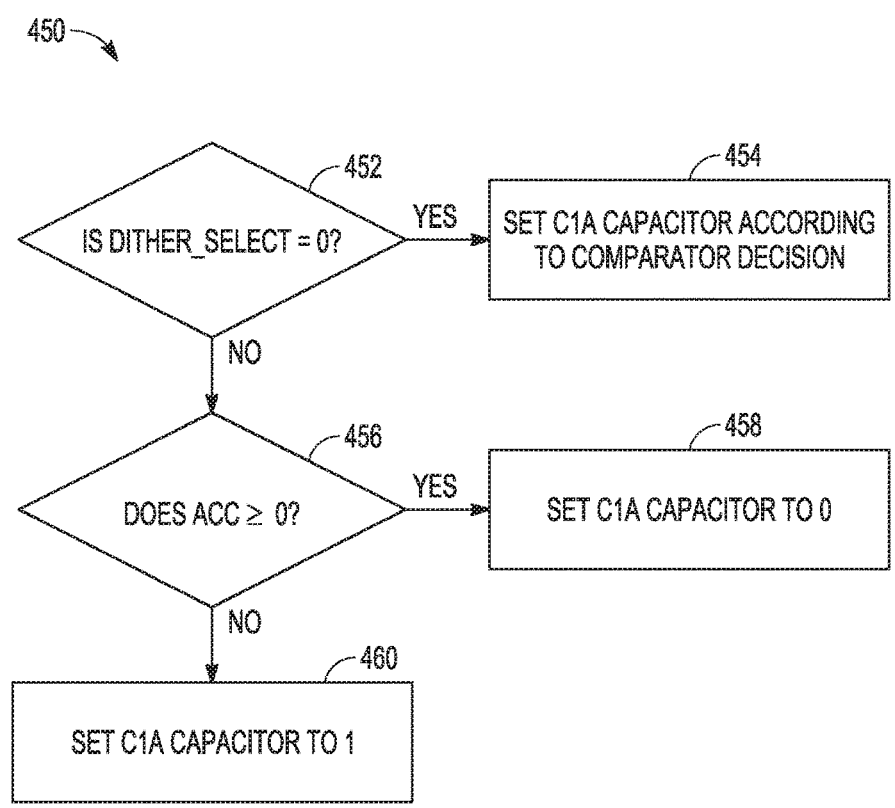
FIG. 8 is a flow diagram depicting an operation of the dither control circuit of FIG. 7.

FIG. 8 is a flow diagram depicting an operation of the dither control circuit 400 of FIG. 7. The flow diagram 450 begins at decision block 452. In particular, if the dither select signal equals 0 ("YES" branch of decision block 452), then, at block 454, the dither control circuit 400 of FIG. 7 can set the capacitor, e.g., capacitor C1$a$ of FIG. 7, according to a comparator decision, e.g., using the bit trial result "b0". If the dither select signal does not equal 0 ("NO" branch of decision block 452), then the flow diagram moves to decision block 456.

At the decision block 456, if the dither control circuit 400 of FIG. 7 determines that the accumulated history of the digital filter circuit 400 is greater than or equal to 0 ("YES branch of decision block 456), then, at block 458, the dither control circuit 400 of FIG. 7 can set the C1a capacitor to "0". If the dither control circuit 400 of FIG. 7 determines that the accumulated history of the digital filter circuit 402A is not greater than 0 ("NO" branch of decision block 456), then, at block 460, the dither control circuit 400 of FIG. 7 can set the C1a capacitor to "1".

The flow diagram in FIG. 8 describes the operation of the top portion of FIG. 7. The bottom portion of FIG. 7 operates similarly, but in a complementary manner. For example, if the dither select signal equals 1 then the dither control circuit 400 of FIG. 7 can set the capacitor C1b of FIG. 7, according to a comparator decision, e.g., using the bit trial result "b0".

Figure 9:
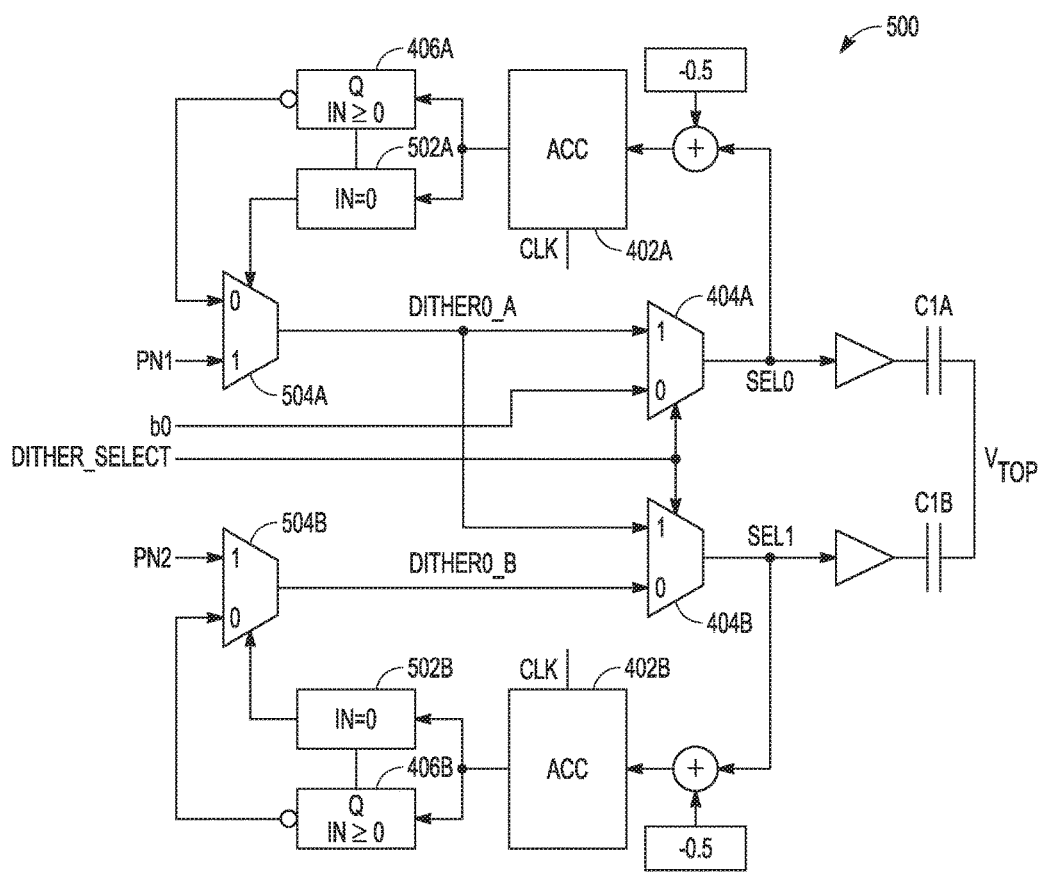
FIG. 9 is a schematic diagram of another example of a dither control circuit that can be used to implement various techniques of this disclosure.

FIG. 9 is a schematic diagram of another example of a dither control circuit 500 that can be used to implement various techniques of this disclosure. The dither control circuit 500 is an example of dither control circuits 210A, 210B in FIG. 2.

A select signal (e.g., "sel0" and "sel1") can be applied to a selected capacitor, e.g., C1a or C1b. The select signal can be either a dither signal or the result of a comparator decision and can control a state of a capacitor to which it is applied, e.g., a state representing a "1" and a state representing a "0".

The dither control circuit 500 shown in FIG. 9 can control both capacitors C1a and C1b and can correct for tone generation that can be caused by the circuit in FIG. 7. Many of the components shown in FIG. 9 are similar to those shown in FIG. 7 and, as such, similar reference numbers will be used. In addition, much of the operation of the dither control circuit 500 of FIG. 9 is similar to the operation of the dither control circuit 400 of FIG. 7.

In the example shown in FIG. 9, the dither control circuit 500 is configured to receive four input signals: 1) a bit trial result (shown as "b0", as an example); 2) a dither select signal ("dither_select") from the control logic, e.g., SAR logic control circuitry 106 of FIG. 2; and 3) two pseudo-random signals PN1 and PN2. The dither select signal can be, for example, a random signal, a pseudo-random signal, and a chopping signal.

The dither control circuit 500 of FIG. 9 further includes a digital filter circuit 402A, e.g., accumulator, integrator, counter, that is configured to accumulate a history of the output of a multiplexer ("mux") 404A, e.g., a running total of the 1s and 0s. In FIG. 9, the output of the mux 404A is summed with a value, e.g., shown as −0.5, and applied to an input of the digital filter circuit 402A. If the output of the mux 404A is a "1", then the accumulation increases, and if the output of the mux 404A is a "0", then the accumulation decreases.

In contrast to the circuit 400 of FIG. 7, the output of the digital filter circuit 402A is coupled to the inputs of two quantizers, quantizer 406A, 502A, e.g., two 1-bit quantizers. The quantizer 406A compares its input (the output of the digital filter circuit 402A) to the value 0 and outputs a "1" to the "0" input of the mux 504A if its input is greater than or equal to 0. The output of the quantizer 502A controls the mux 504A.

The quantizer 502A compares its input (the output of the digital filter circuit 402A) to the value 0 and outputs a "1" to the mux 504A if its input is equal to 0. That is, if the accumulated history is 0 (e.g., no error has accumulated in the digital filter circuit 402A), then the control signal from the quantizer 502A selects the pseudo-random input signal PN1, which is applied to the "1" input of the mux 504A and to the capacitor C1a if the dither signal selects the capacitor C1a to receive the dither signal (as described above with respect to FIG. 7).

If the quantizer 502A compares its input (the output of the digital filter circuit 402A) to the value 0 and outputs a "0" to the mux 504A if its input does not equal 0 (e.g., no error has accumulated in the digital filter circuit 402A), then the inverted output from the quantizer 406A applied to the "0" input of the mux 504A is applied to the capacitor C1a if the dither signal selects the capacitor C1a to receive the dither signal (as described above with respect to FIG. 7).

The mux 404A, which is controlled by the dither select signal, is configured to receive 1) the output of the mux 504A at its "1" input and 2) a comparator decision at its "0" input, e.g., bit trial result "b0" from FIG. 2. The dither select signal selects which capacitor, e.g., C1a or C1b, receives a dither signal and which capacitor receives the result of a comparator decision, e.g., bit trial result "b0", by selecting one of the first and second inputs.

If the dither select signal is "0", then the capacitor C1a is set according to the comparator decision, e.g., the bit trial result "b0". If the dither select signal is "1" and the accumulated history does not equal 0, then a dither signal is applied to capacitor C1a based on the output of the quantizer 404A.

The bottom portion of the dither control circuit 500 includes similar components to the top portion of FIG. 9 and operates in a manner similar what was described above. For purposes of conciseness, the bottom portion of the dither control circuit 500 will not be described in detail. The bottom portion of the dither control circuit 500 includes a mux 504B to receive a second pseudo-random signal PN2 at its "1" input and an output of a quantizer 406B at its "0" input, a mux 404B to receive the output of the mux 504B at its "0" input and the comparator decision (e.g., the bit trial result "b0") at its "1" input, and a digital filter circuit 402B.

It should be noted that the bottom portion operates in a complementary manner to the top portion. For example, if the dither select signal is "0", then the dither control circuit 500 1) sets capacitor C1a according to the comparator decision, e.g., using bit trial result "b0", and 2) sets capacitor C1b to receive a dither signal, as described above.

Figure 10:
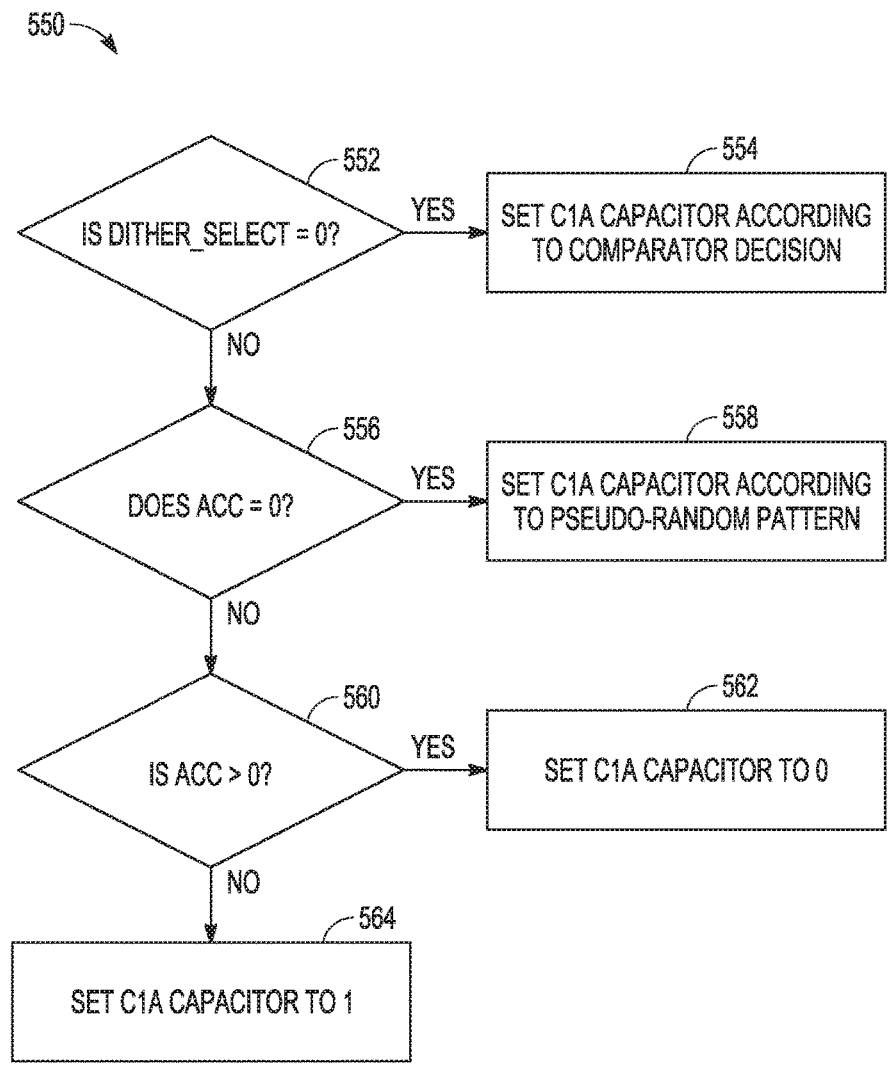
FIG. 10 is a flow diagram depicting an operation of the dither control circuit of FIG. 9.

FIG. 10 is a flow diagram depicting an operation of the dither control circuit 500 of FIG. 9. The flow diagram 550 begins at decision block 552. If the dither select signal equals 0 ("YES" branch of decision block 552), then, at block 554, the dither control circuit 500 of FIG. 9 can set the capacitor, e.g., capacitor C1a of FIG. 9, according to a comparator decision, e.g., using the bit trial result "b0". If the dither select signal does not equal 0 ("NO" branch of decision block 552), then the flow diagram moves to decision block 556.

At the decision block 556, if the dither control circuit 500 of FIG. 9 determines that the accumulated history of the digital filter circuit 402A is equal to 0 ("YES" branch of decision block 556), then, at block 558, the dither control circuit 500 of FIG. 9 can set the C1a capacitor to according to a pseudo-random pattern, e.g., using PN1 in FIG. 9). If the dither control circuit 500 of FIG. 9 determines that the accumulated history of the digital filter circuit 402A does not equal 0 ("NO" branch of decision block 556), then the flow diagram moves to decision block 560.

At the decision block 560, if the dither control circuit 500 of FIG. 9 determines that the accumulated history of the digital filter circuit 402A is greater than 0 ("YES" branch of decision block 560), then, at block 562, the dither control circuit 500 of FIG. 9 can set the C1a capacitor to "0". If the dither control circuit 500 of FIG. 9 determines that the accumulated history of the digital filter circuit 402A is not greater than 0 ("NO" branch of decision block 560), then, at block 564, the dither control circuit 500 of FIG. 9 can set the C1a capacitor to "1".

The flow diagram in FIG. 10 describes the operation of the top portion of FIG. 9. The bottom portion of FIG. 9 would be operated similarly, but in a complementary manner. For example, if the dither select signal equals 1 then the dither control circuit 500 of FIG. 9 can set the capacitor C1b of FIG. 9, according to a comparator decision, e.g., using the bit trial result "b0".

Figure 11:
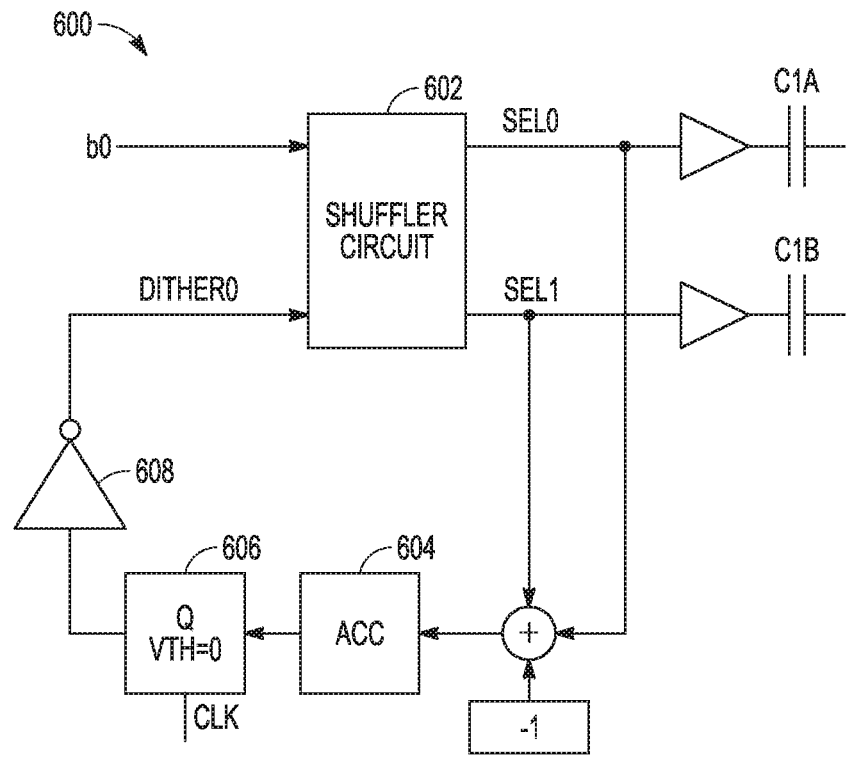
FIG. 11 is a schematic diagram of another example of a dither control circuit that can be used to implement various techniques of this disclosure.

FIG. 11 is a schematic diagram of another example of a dither control circuit 600 that can be used to implement various techniques of this disclosure. The dither control circuit 600 is an example of dither control circuits 210A, 210B in FIG. 2. The dither control circuit 600 of FIG. 11 can include a shuffler circuit 602. As seen in FIG. 11, the dither control circuit 600 can receive a comparator decision, e.g., bit trial result "b0", which is also an input to the shuffler circuit 602. The shuffler circuit 602 (and the dither control circuit 600), have two outputs, namely signals "sel0" and "sel1", which are coupled to and drive the capacitors C1a and C1b, respectively.

The dither control circuit 600 of FIG. 11 further includes a digital filter circuit 604, e.g., accumulator, integrator, counter, that is configured to accumulate a history of the output of the shuffler circuit 602, e.g., a running total of the 1s and 0s. In FIG. 11, both outputs of the shuffler circuit 602, namely signals "sel0" and "sel1", are summed with a value, e.g., shown as −1, and applied to an input of the digital filter circuit 604.

The output of the digital filter circuit 600 is coupled to an input of quantizer 606, e.g., a 1-bit quantizer. The quantizer 606 compares its input (the output of the digital filter circuit 604) to the value 0 and outputs a "1" if its input is equal to 0. The output of the quantizer 606 is inverted by inverter 608 and fed to the shuffler circuit 602 as a dither signal "dither0".

As indicated above, the digital filter circuit 600 accumulates a running total of the 1s and 0s of the signals "sel0" and "sel1", where one of the two signals is a result of a comparator decision, e.g., bit trial result "b0", and the other is a dither signal. Ideally, one of the capacitors C1a and C1b is set to "1" and the other capacitor is set to "0" and, as such, the accumulation in the digital filter circuit 604 is zero. The digital filter circuit 604 outputs a "0" to the quantizer 606. The quantizer 606 outputs a "1", which after being inverted by inverter 608 is a dither signal "0" applied to an input of the shuffler circuit 602.

The shuffler circuit 602 attempts to modulate any aggregated error, e.g., accumulated history, rather than modulate the individual capacitors, e.g., capacitors C1a and C1b. By shuffling the dither signal (from the inverter 608) and the comparator decision signal (e.g., bit trial result "b0"), the shuffler circuit 602 tries to make the capacitors (e.g., capacitors C1a and C1b) look identical over time, although they are likely mismatched due to manufacturing errors. Using the shuffler circuit, any mismatch is modulated.

Figure 12:
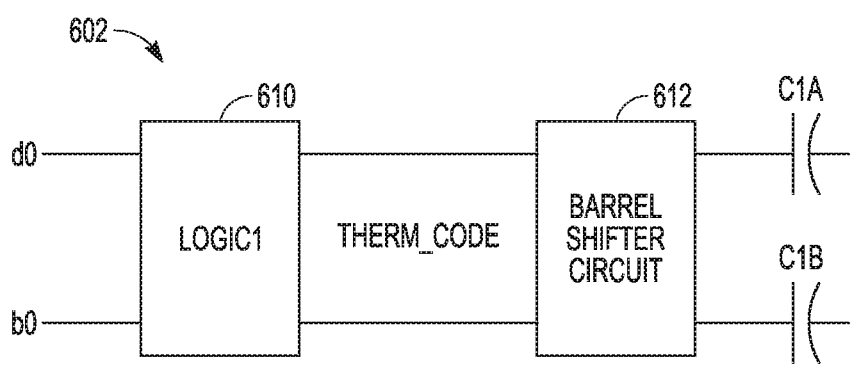
FIG. 12 is a schematic diagram of an example of a shuffler circuit that can be used to implement various techniques of this disclosure.

FIG. 12 is a schematic diagram of an example of a shuffler circuit 602 that can be used to implement various techniques of this disclosure. The shuffler circuit 602 can receive two inputs, namely a dither signal "d0" (e.g., "dither0" in FIG. 11) and a result of a comparator decision "b0", e.g., a bit trial result. The "logic1" circuit 610 maps the input code to an output thermometer code. An example of a "logic1" circuit mapping of input codes to output codes is shown below in Table 1:

TABLE 1

| Dither Signal "d0" | Comparator Decision "b0" | Thermometer Code "therm_code" |
|---|---|---|
| 0 | 0 | 00 |
| 0 | 1 | 01 |
| 1 | 0 | 01 |
| 1 | 1 | 11 |

As seen in FIG. 12, the thermometer code "therm_code" can be applied to a barrel shifter circuit 612 that shifts the thermometer code to produce a noise-shaped shuffled output, which is applied to the capacitors C1a and C1b. Although a barrel shifter circuit is shown, other circuits, including a butterfly shuffler, could be used.

In this manner, a dither control circuit, e.g., dither control circuit 600 of FIG. 11, can include a dither-controlled shuffler circuit to provide noise-shaped dither to capacitors in an array, e.g., capacitors C1a and C1b of FIG. 2.

As indicated above, capacitors may be mismatched due to manufacturing errors. For example, assume that the capacitor C1a has a capacitance of $C+\Delta C_{1a}$ and that the capacitor C1b has a capacitance of $C+\Delta C_{1b}$. The average error $\Delta C$ of the two capacitors is equal to $(\Delta C_{1a}+\Delta C_{1b})/2$, such that both capacitors C1a and C1b have a capacitance of $C+\Delta C$ on average. Using the equivalent capacitance of $C+\Delta C$, an example of an operation of the dither control circuit 600 of FIG. 11 is shown below in Table 2:

TABLE 2

| | dither0(n) | b0(n) | ACC(n) | Accumulated Charge Error |
|---|---|---|---|---|
| Initial state | | | 0 | 0 |
| n = 0 | 0 | 0 | −1 | −$\Delta C$ |
| n = 1 | 1 | 0 | −1 | −$\Delta C$ |
| n = 2 | 1 | 0 | −1 | −$\Delta C$ |
| n = . . . | 1 | 0 | −1 | −$\Delta C$ |
| n = N | 1 | 0 | −1 | −$\Delta C$ |

In example shown above in Table 2, "ACC(n)" is the accumulation, or output of a digital filter circuit, e.g., digital filter circuit 604 of FIG. 11. Here, the bit trial result "b0" is always 0 and thus ACC(n) remains at −1. The average error contributed from the two capacitors over N cycles is equal to $(-\Delta C)/N$. If N is sufficiently large, the average error approaches 0. This is more likely to happen when the signal is not very busy and the bit trial result is the same from sample to sample.

Another example of an operation of the dither control circuit 600 of FIG. 11 is shown below in Table 3:

TABLE 3

| | dither0(n) | b0(n) | ACC(n) | Accumulated Charge Error |
|---|---|---|---|---|
| Initial state | | | 0 | 0 |
| n = 0 | 0 | 0 | −1 | −$\Delta C$ |
| n = 1 | 1 | 1 | 0 | 0 |
| n = 2 | 0 | 0 | −1 | −$\Delta C$ |
| n = 3 | | | | |
| n = . . . | | | | |
| n = N | 1 | 0 | 0 | 0 |

In example shown above in Table 3, "ACC(n)" is the accumulation, or output of a digital filter circuit, e.g., dither filter circuit 604 of FIG. 11. Here, the bit trial result "b0" is busy and changes from sample to sample. The average error contributed from the two capacitors over N cycles is 0. This is more likely to happen when the signal is busy and the bit trial result is different from sample to sample.

Figure 13:
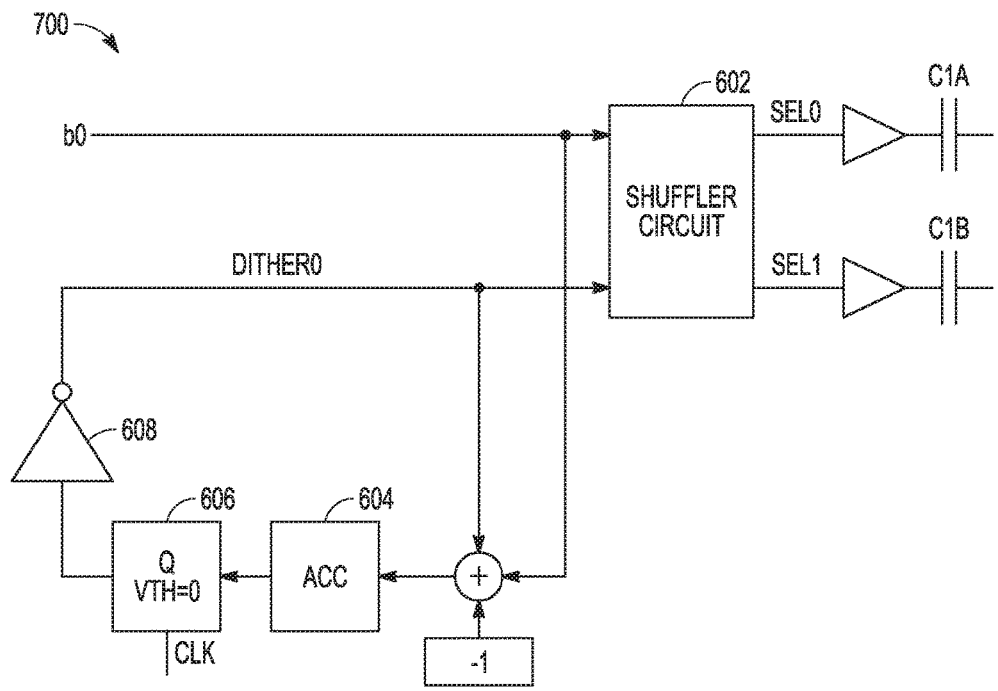
FIG. 13 is a schematic diagram of another example of a dither control circuit that can be used to implement various techniques of this disclosure.

FIG. 13 is a schematic diagram of another example of a dither control circuit 700 that can be used to implement various techniques of this disclosure. The dither control circuit 700 is an example of dither control circuits 210A, 210B in FIG. 2. The dither control circuit 700 of FIG. 13 is similar to the dither control circuit 600 of FIG. 11 and similar reference numbers are used for similar components. In FIG. 13, the digital filter circuit 604 is coupled to the inputs of the shuffler circuit 602, in contrast to the circuit 600 of FIG. 11. The operation of the dither control circuit 700 of FIG. 13 is similar to the dither control circuit 600 of FIG. 11 and, for purposes of conciseness, will not be described again.

Figure 14:
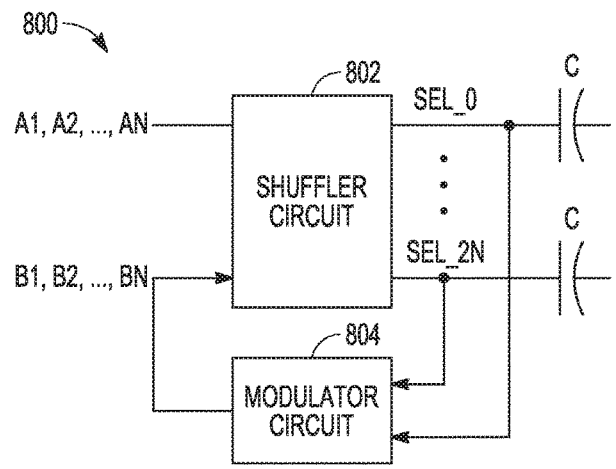
FIG. 14 is a schematic diagram of another example of a dither control circuit that can be used to implement various techniques of this disclosure.

FIG. 14 is a schematic diagram of another example of a dither control circuit that can be used to implement various techniques of this disclosure. The dither control circuit 800 of FIG. 14 is a generalized diagram illustrating that the dither control circuits of FIGS. 11 and 13 can be extended to an arbitrary number of bits. The dither control circuit 800 of FIG. 14 can include a shuffler circuit 802 and a modulator circuit 804 that can include digital filter circuits, quantizers, and inverters, as described above.

The dither control circuit 800 of FIG. 14 can receive the results of a comparator decision, e.g., bits A1-An, and the dither signals, e.g., dither signals B1-Bn, generated by the modulator circuit 804. The shuffler circuit 802 can shuffle the received signals and output the shuffled signals to the capacitors of the array.

Figure 15:
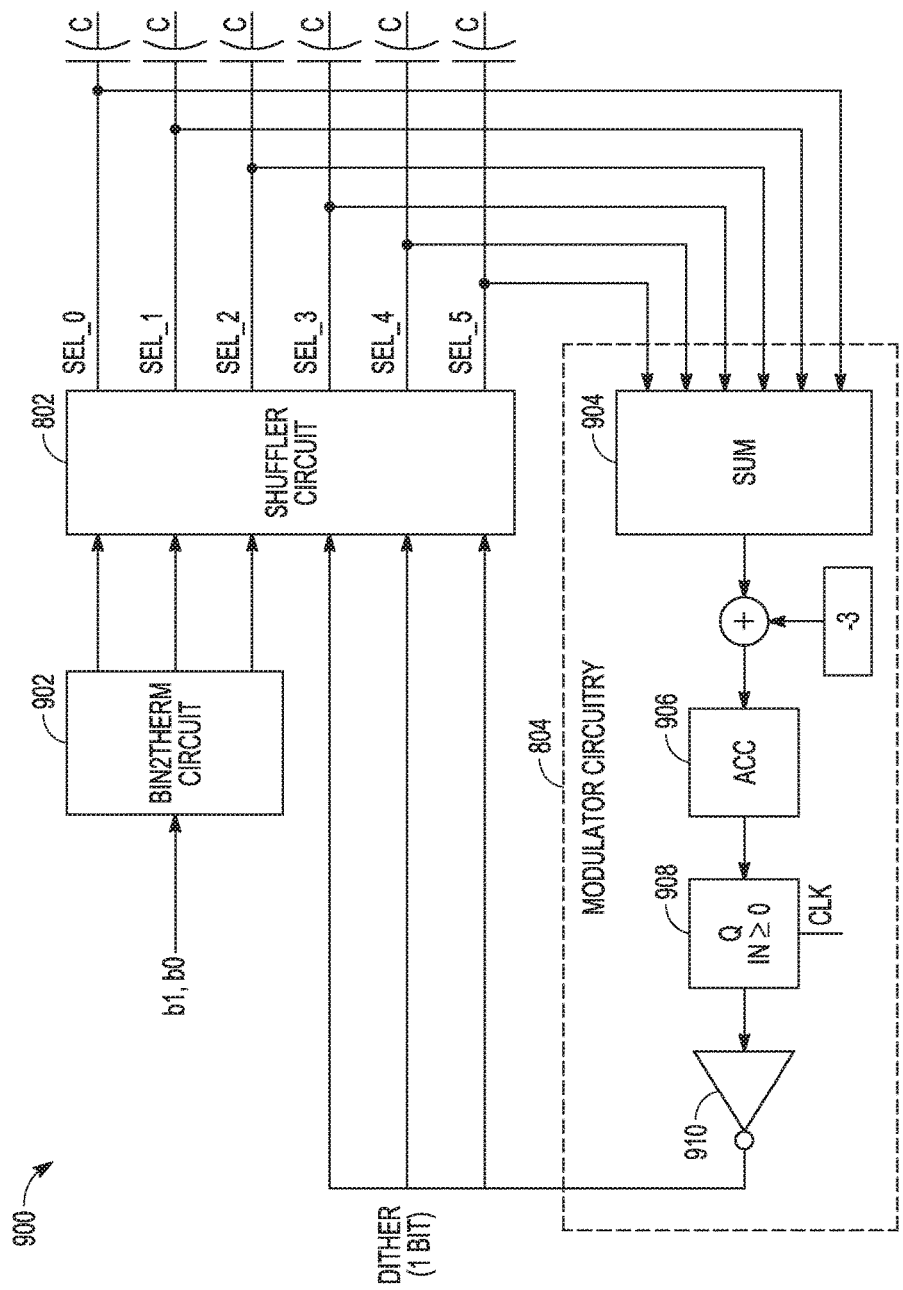
FIG. 15 is a schematic diagram of an example of the dither control circuit in FIG. 14 that can be used to implement various techniques of this disclosure.

FIG. 15 is a schematic diagram of an example of the dither control circuit in FIG. 14 that can be used to implement various techniques of this disclosure. The circuit 900 of FIG. 15 includes a binary-to-thermometer ("bin2therm") code circuit 902 coupled to a shuffler circuit 802. Comparator decisions "b0" and "b1", e.g., bit trial results, are received by the bin2therm circuit XX, converted to thermometer code, and fed to the shuffler circuit 802. In the non-limiting example shown in FIG. 15, the shuffler circuit 802 outputs the bit trial results, e.g., "b0", "b1", as signals "sel_0" through "sel_5", which are applied to corresponding capacitors C.

A modulator circuit 804 can include a summer circuit 904, an accumulator circuit 906, a quantizer circuit 908, e.g., a 1-bit quantizer, and an inverter 910. Based on the value in the accumulator circuit 906, a dither value, e.g., 1-bit dither value, is determined. As seen in FIG. 15, the output of the modulator 804 is coupled to inputs of the shuffler circuit 802 and the dither signal can control three capacitors that are selected by shuffler circuit 802. As described above, the dither signal attempts to bring the accumulator value towards zero, e.g., balanced. When the value in the accumulator is zero, a random dither bit can be applied to the shuffler circuit 802.

Figure 16:
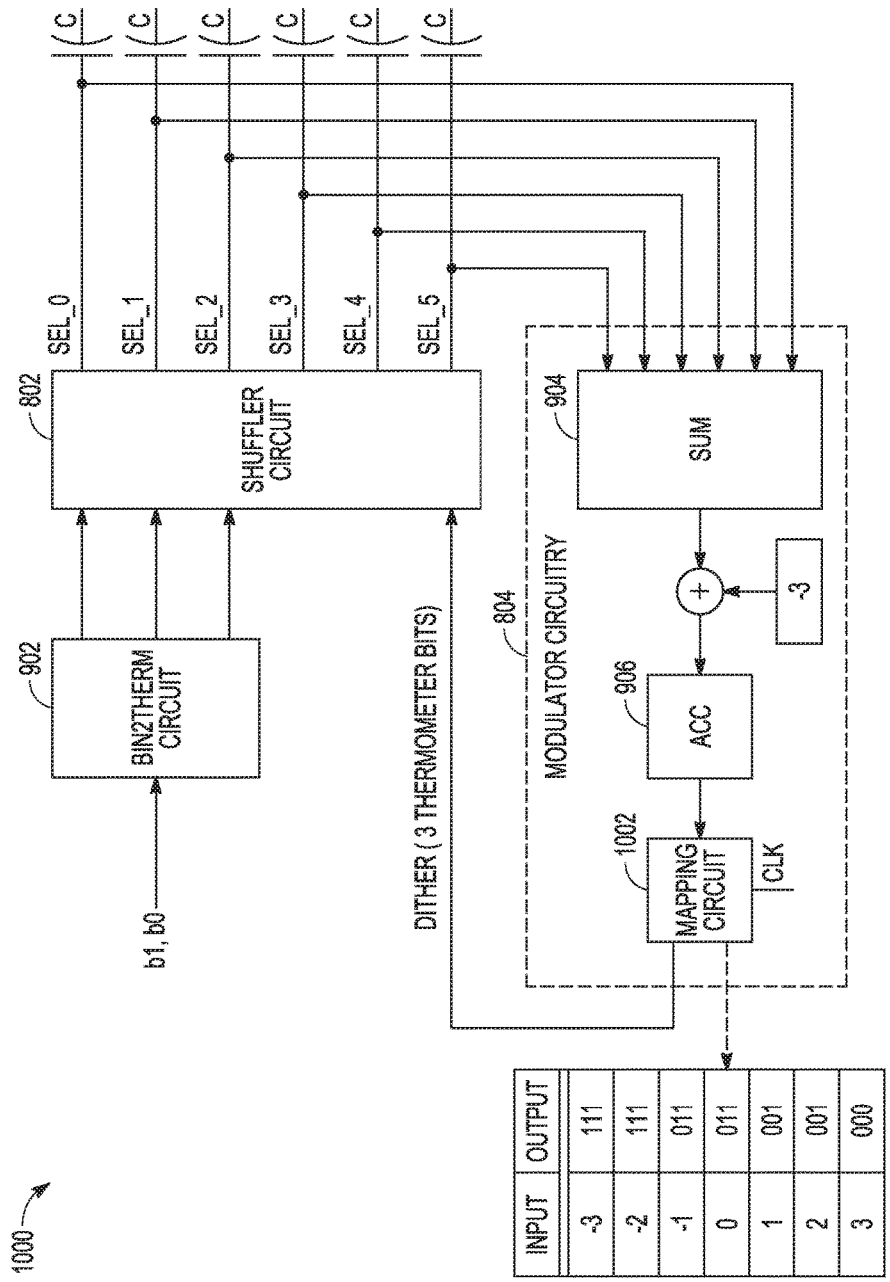
FIG. 16 is a schematic diagram of another example of the dither control circuit in FIG. 14 that can be used to implement various techniques of this disclosure.

FIG. 16 is a schematic diagram of another example of the dither control circuit in FIG. 14 that can be used to implement various techniques of this disclosure. The circuit 1000 of FIG. 16 includes a binary-to-thermometer ("bin2therm") code circuit 902 coupled to a shuffler circuit 802. Comparator decisions "b0" and "b1", e.g., bit trial results, are received by the bin2therm circuit XX, converted to thermometer code, and fed to the shuffler circuit 802. In the non-limiting example shown in FIG. 15, the shuffler circuit 802 outputs the bit trial results, e.g., "b0", "b1", as signals "sel_0" through "sel_5", which are applied to corresponding capacitors C.

A modulator circuit 804 can include a summer circuit 904, an accumulator circuit 906, a quantizer circuit 908, e.g., a 1-bit quantizer, and a mapping circuit 1002. The mapping circuit XX can function essentially as a multi-bit quantizer. An example input-output relationship is depicted in FIG. 16, e.g., thermometer code. Based on the value in the accumulator circuit 906, three dither bits are determined. The three dither bits of the dither signal can control three capacitors, respectively, that are selected by shuffler circuit 802. As described above, the dither signal attempts to bring the accumulator value towards zero, e.g., balanced. When the value in the accumulator is zero, a random dither bit can be applied to the shuffler circuit 802.

Figure 17:
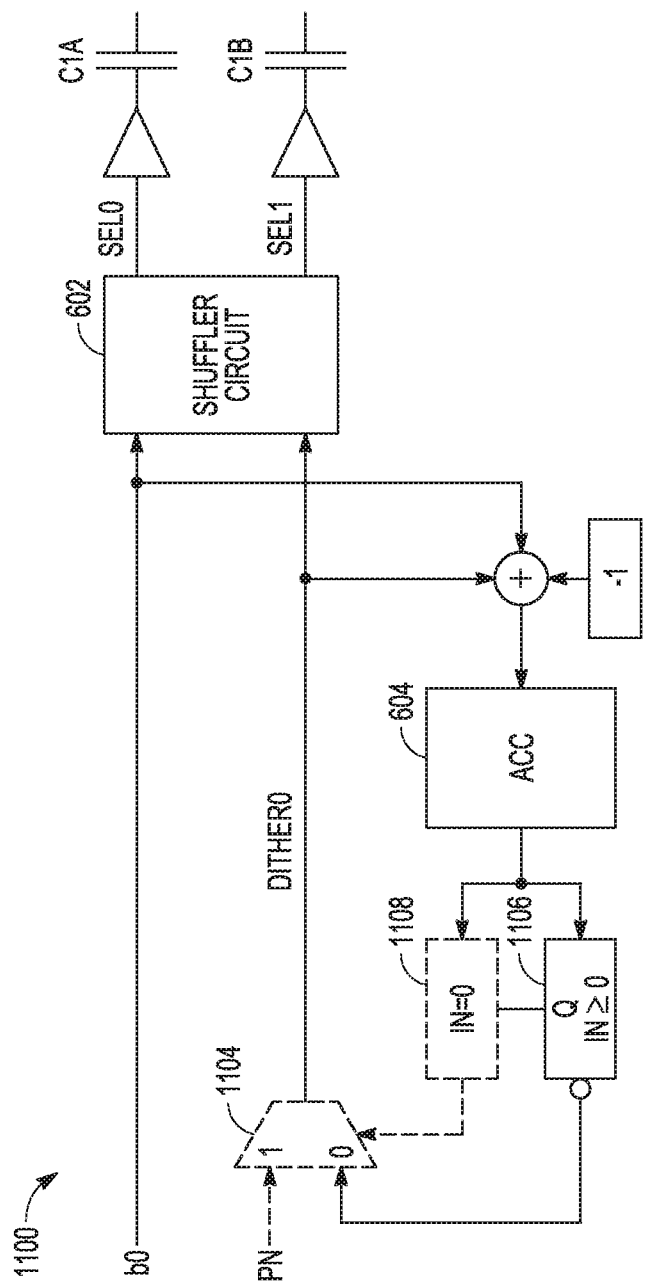
FIG. 17 is a schematic diagram of another example of a dither control circuit that can be used to implement various techniques of this disclosure.

FIG. 17 is a schematic diagram of another example of a dither control circuit 1100 that can be used to implement various techniques of this disclosure. The dither control circuit 1100 is similar to the circuit 600 of FIG. 11, except a pseudo-random signal PN is also applied the shuffler circuit.

The dither control circuit 1100 of FIG. 17 can include a shuffler circuit 602. As seen in FIG. 17, the dither control circuit 1100 can receive a comparator decision, e.g., bit trial result "b0", which is also an input to the shuffler circuit 602. The shuffler circuit 602 (and the dither control circuit 1100), have two outputs, namely signals "sel0" and "sel1", which are coupled to and drive the capacitors C1$a$ and C1$b$, respectively. The dither control circuit 1100 is configured to receive two input signals: 1) a bit trial result (shown as "b0", as an example); and 2) pseudo-random signal PN applied to the "1" input of mux 1104.

The dither control circuit 1100 of FIG. 17 further includes a digital filter circuit 604, e.g., accumulator, integrator, counter, that is configured to accumulate a history of the output of a multiplexer ("mux") 1104, e.g., a running total of the 1s and 0s. The output of the mux 1104 is summed with a value, e.g., shown as −0.1, and applied to an input of the digital filter circuit 604. If the output of the mux 604 is a "1", then the accumulation increases, and if the output of the mux 604 is a "0", then the accumulation decreases.

The output of the digital filter circuit 604 is coupled to the inputs of two quantizers, quantizer 1106, 1108, e.g., two 1-bit quantizers. The quantizer 1108 compares its input (the output of the digital filter circuit 604) to the value 0 and outputs a "1" to the "0" input of the mux 1104 if its input is greater than or equal to 0. The output of the quantizer 1108 controls the mux 1104.

The quantizer 1108 compares its input (the output of the digital filter circuit 604) to the value 0 and outputs a "1" to the mux 1104 if its input is equal to 0. That is, if the accumulated history is 0 (e.g., no error has accumulated in the digital filter circuit 604), then the control signal from the quantizer 1108 selects the pseudo-random input signal PN applied to the "1" input of the mux 1104 to apply to the shuffler circuit 602.

If the quantizer 1108 compares its input (the output of the digital filter circuit 604) to the value 0 and outputs a "0" to the mux 1104 if its input does not equal 0 (e.g., no error has accumulated in the digital filter circuit 604), then the inverted output from the quantizer 1106 applied to the "0" input of the mux 1104 is applied to the shuffler circuit 602.

When the value of the accumulator 604 is 0, which means the total usage of capacitor C1$a$ and C1$b$ is balanced between "1" and "0", the dither0 signal will be randomly decided by the pseudo-random input signal PN instead of by the quantizer 1106 after the accumulator 604. An advantage of FIG. 17 can be to provide randomization in the generated dither0 signal bit stream to break any tones in the generated dither0 signal.

The shuffler circuit 602 attempts to modulate any aggregated error, e.g., accumulated history, rather than modulate the individual capacitors, e.g., capacitors C1a and C1b. By shuffling the dither signal (from the mux 1104) and the comparator decision signal (e.g., bit trial result "b0"), the shuffler circuit 602 tries to make the capacitors (e.g., capacitors C1a and C1b) look identical over time, although they are likely mismatched due to manufacturing errors. Using the shuffler circuit, any mismatch is modulated.

An example of an operation of the dither control circuit 1100 of FIG. 17 is shown below in Table 4:

TABLE 4

|  | dither0(n) | b0(n) | PN(n) | ACC(n) | Accumulated Charge Error |
|---|---|---|---|---|---|
| Initial state |  |  |  | 0 | 0 |
| n = 0 | 0 | 0 | 0 | −1 | −ΔC |
| n = 1 | 1 | 1 | 1 | 0 | 0 |
| n = 2 | 1 | 0 | 1 | −1 | ΔC |
| n = 3 |  |  |  |  |  |
| n = . . . |  |  |  |  |  |
| n = N − 1 | 0 | 0 | 0 | −1 | −ΔC |
| n = N | 1 | 0 | 1 | 0 | 0 |

In example shown above in Table 4, "ACC(n)" is the accumulation, or output of a digital filter circuit, e.g., dither filter circuit 604 of FIG. 17. A pseudo-random number signal PN is included. When the accumulator value is zero, the dither control circuit can apply random dither, which can help the accumulator output be symmetrical.

Figure 18:
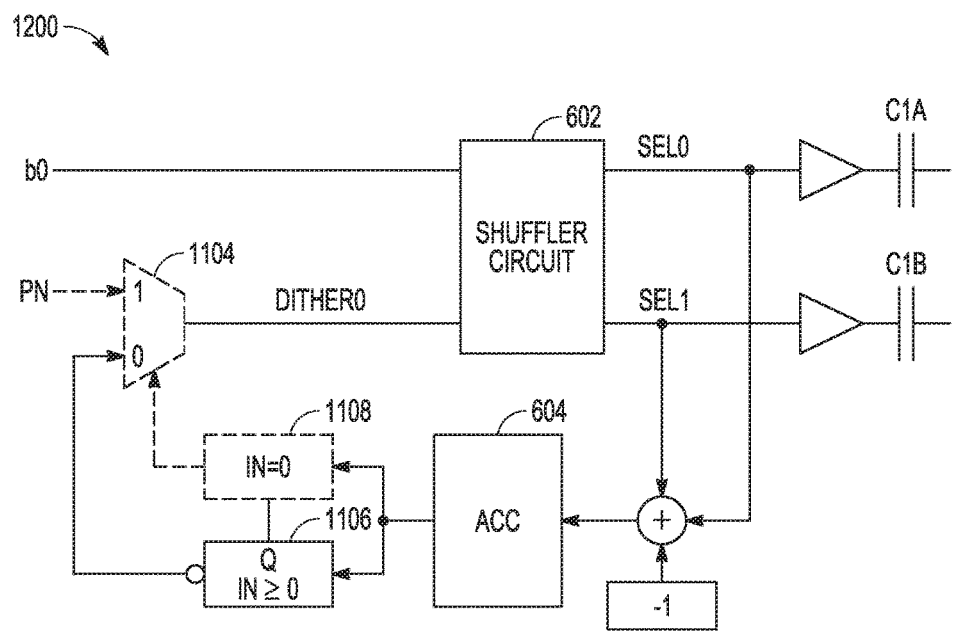
FIG. 18 is a schematic diagram of another example of a dither control circuit that can be used to implement various techniques of this disclosure.
Figure 9:
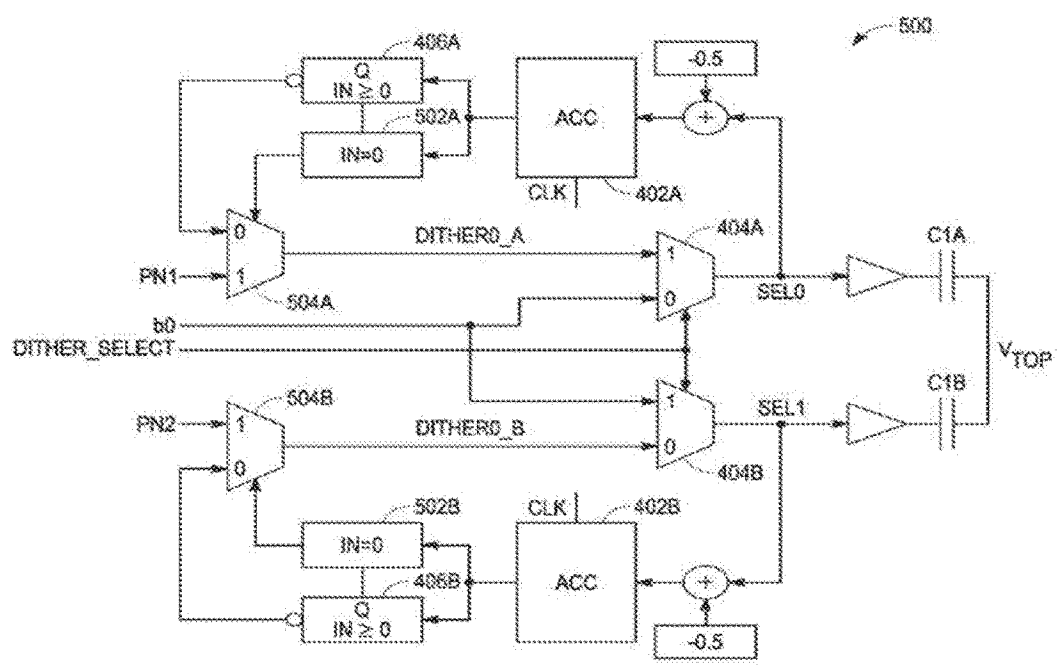

FIG. 18 is a schematic diagram of another example of a dither control circuit 1200 that can be used to implement various techniques of this disclosure. The dither control circuit 1200 of FIG. 18 is similar to the dither control circuit 1100 of FIG. 17 and similar reference numbers are used for similar components. In FIG. 18, the digital filter circuit 604 is coupled to the outputs of the shuffler circuit 602, in contrast to the circuit 1100 of FIG. 17. The operation of the dither control circuit 1200 of FIG. 18 is similar to the dither control circuit 1100 of FIG. 17 and, for purposes of conciseness, will not be described again.

Various Notes

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. An analog-to-digital converter (ADC) circuit to apply noise-shaped dither after a sampling phase, the ADC circuit comprising:

a digital-to-analog converter (DAC) circuit having a capacitor array; and
a dither control circuit configured to control, after the sampling phase, a selection between:
at least two capacitors, including:
a capacitor in the array to receive a dither signal; and
a capacitor in the array to be set dependent on a comparator decision during a conversion,
wherein, over a number of conversions, the dither control circuit is configured to change the selection of which capacitor receives the dither signal and which capacitor is to be set dependent on a comparator decision during the conversion.

2. The ADC circuit of claim 1, wherein the dither control circuit includes:
a digital filter circuit configured to accumulate or process a difference between a number of times the at least two capacitors are set to 1 and a number of times the at least two capacitors are set to 0 during previous conversions; and
a shuffler circuit coupled to an output of the digital filter circuit, wherein outputs of the shuffler circuit are coupled to the at least two capacitors, the shuffler circuit configured to:
receive the dither signal and a signal ("$b_x$") representing a bit-trial result of a bit-trial phase;
shuffle the received signals; and
apply the shuffled signals to the outputs of the shuffler circuit.

3. The ADC circuit of claim 1, wherein the selection bounds a difference between a number of times each of the at least two capacitors is set to 1 and a number of times each of the at least two capacitors is set to 0 during previous conversions.

4. The ADC circuit of claim 1, wherein the digital control circuit includes:
a digital filter circuit configured to accumulate or process a difference between a number of times each of the at least two capacitors is set to 1 and a number of times each of the at least two capacitors is set to 0 during previous conversions,
wherein the dither control circuit is configured to control the selection of the capacitor to receive the dither signal based on the accumulation.

5. The ADC circuit of claim 4, wherein the dither control circuit is configured to:
receive a dither select signal and a signal ("$b_x$") representing a bit-trial result of the conversion; and
control, using a capacitor select signal ("$sel_x$"), a state of the at least two capacitors in the array, wherein the $sel_x$ signal is based on the dither select signal, the $b_x$ signal, and the capacitor usage of the at least two capacitors during previous conversions.

6. The ADC circuit of claim 5, wherein when the dither select signal is a first logic level, the $sel_x$ signal is dependent upon the $b_x$ signal, and wherein when the dither select signal is a second logic level, the $sel_x$ signal is dependent upon the capacitor usage of the at least two capacitors during previous conversions.

7. The ADC circuit of claim 5, wherein the dither select signal is selected from a group consisting of a pseudo-random signal, a random signal, and a chopping signal.

8. The ADC circuit of claim 5, wherein the dither control circuit includes a limit circuit coupled to a digital filter circuit output, wherein limit circuit output is used to bound the accumulation or processing.

9. The ADC circuit of claim 8, wherein the limit circuit is configured to compare the digital filter circuit output to a limit, and
wherein the limit circuit output is used to prevent the capacitor in the array from being selected to be set dependent on the comparator decision.

10. The ADC circuit of claim 5, wherein the dither signal is either a random dither signal or a dither signal based on the accumulation or processing,
wherein the dither control circuit further includes a conditional circuit coupled to the digital filter circuit, the conditional circuit configured to apply either the random dither signal or the dither signal based on the accumulation or processing.

11. The ADC circuit of claim 10, wherein the conditional circuit is configured to apply the random dither signal when the accumulation or processing equals a value.

12. The ADC circuit of claim 11, wherein the dither control circuit is configured to control the selection of the capacitor to receive the dither signal to reduce a magnitude of the accumulation or processing.

13. The ADC circuit of claim 1, wherein the at least two capacitors are paired such that when one capacitor is selected to receive the dither signal, the other capacitor is set dependent on the comparator decision.

14. A method of applying noise-shaped dither after a sampling phase in an analog-to-digital converter (ADC) circuit, the method comprising:
providing a digital-to-analog converter (DAC) circuit having a capacitor array;
controlling, after the sampling phase, a selection between:
at least two capacitors, including:
a capacitor in the array to receive a dither signal; and
a capacitor in the array to be set dependent on a comparator decision during a conversion; and
over a number of conversions, changing the selection of which capacitor receives the dither signal and which capacitor is to be set dependent on a comparator decision during the conversion.

15. The method of claim 14, further comprising:
accumulating or processing a difference between a number of times each of the at least two capacitors is set to 1 and a number of times each of the at least two capacitors is set to 0 during previous conversions,
wherein controlling the selection of the capacitor to receive the dither signal is based on the accumulation or processing.

16. The method of claim 15, further comprising:
receiving a dither select signal and a signal ("$b_x$") representing a bit-trial result of the conversion; and
controlling, using a capacitor select signal ("$sel_x$"), a state of the at least two capacitors in the array, wherein the $sel_x$ signal is based on the dither select signal, the $b_x$ signal, and the capacitor usage of the at least two capacitors during previous conversions.

17. The method of claim 14, further comprising:
bounding a difference between a number of times each of the at least two capacitors is set to 1 and a number of times each of the at least two capacitors is set to 0 during previous conversions.

18. The method of claim 14, further comprising:
accumulating or processing a difference between a number of times the at least two capacitors are set to 1 and a number of times the at least two capacitors are set to 0 during previous conversions;
receiving the dither signal and a signal ("$b_x$") representing a bit-trial result of a bit-trial phase;

shuffling the received signals; and applying the shuffled signals to outputs of a shuffler circuit, wherein the outputs of the shuffler circuit are coupled to the at least two capacitors.

19. An analog-to-digital converter (ADC) circuit to apply noise-shaped dither after a sampling phase, the ADC circuit comprising:

a digital-to-analog converter (DAC) circuit having a capacitor array;

means for controlling, after the sampling phase, a selection between:

at least two capacitors, including:

a capacitor in the array to receive a dither signal; and a capacitor in the array to be set dependent on a comparator decision during a conversion; and over a number of conversions, means for changing the selection of which capacitor receives a dither signal and which capacitor is to be set dependent on a comparator decision during the conversion.

20. The ADC circuit of claim 19, wherein the means for controlling, after the sampling phase, a selection includes:

means for accumulating or processing a difference between a number of times the at least two capacitors are set to 1 and a number of times the at least two capacitors are set to 0 during previous conversions;

means for receiving the dither signal and a signal ("$b_x$") representing a bit-trial result of a bit-trial phase; and means for shuffling the received signals and applying the shuffled signals to the at least two capacitors.

* * * * *

UNITED STATES PATENT AND TRADEMARK OFFICE
CERTIFICATE OF CORRECTION

PATENT NO. : 10,333,543 B1
APPLICATION NO. : 15/975885
DATED : June 25, 2019
INVENTOR(S) : Hurrell et al.

Page 1 of 2

It is certified that error appears in the above-identified patent and that said Letters Patent is hereby corrected as shown below:

In the Drawings

Sheet 8 of 15, delete Fig. 9 and replace with Fig. 9 as shown on the attached sheet.

Signed and Sealed this
Thirteenth Day of July, 2021

Drew Hirshfeld
*Performing the Functions and Duties of the*
*Under Secretary of Commerce for Intellectual Property and*
*Director of the United States Patent and Trademark Office*